United States Patent
Hatakeyama et al.

[11] Patent Number: 6,099,698
[45] Date of Patent: Aug. 8, 2000

[54] MAGNETIC DISC AND METHOD OF MANUFACTURING SAME

[75] Inventors: Masahiro Hatakeyama; Katsunori Ichiki; Kenji Watanabe, all of Fujisawa; Kazuo Yamauchi, Yokohama; Shinta Kunitomo, Fujisawa; Tohru Satake, Chigasaki; Yasushi Tohma, Osaka; Juichi Ishiguro, Yokohama, all of Japan

[73] Assignee: Ebara Corporation, Tokyo, Japan

[21] Appl. No.: 09/165,371

[22] Filed: Oct. 2, 1998

[51] Int. Cl.[7] .............................. C23C 14/46; B01J 19/08
[52] U.S. Cl. .............................. 204/192.15; 204/192.32; 204/192.3; 204/192.34; 204/192.35; 427/595; 427/596; 216/63; 216/66; 216/67; 216/94; 216/42; 216/51; 216/49; 216/37; 216/11; 216/12; 430/313; 430/323
[58] Field of Search ........................ 204/298.36, 298.23, 204/298.04, 192.32, 192.3, 192.15, 192.34, 192.35; 427/127, 128, 130, 131, 132, 596, 595; 430/313, 323, 297; 360/135; 216/63, 66, 67, 94, 42, 51, 49, 37, 12, 11

[56] References Cited

U.S. PATENT DOCUMENTS

| | | | |
|---|---|---|---|
| 4,804,816 | 2/1989 | Hata | 204/192.34 |
| 5,411,630 | 5/1995 | Nagase et al. | 216/22 |
| 5,635,037 | 6/1997 | Chu et al. | 204/192.34 |
| 5,640,009 | 6/1997 | Hatakeyama | 250/251 |
| 5,770,123 | 6/1998 | Hatakeyama et al. | 254/1.21 |
| 5,894,058 | 4/1999 | Hatakeyama et al. | 430/313 |

FOREIGN PATENT DOCUMENTS

| | | |
|---|---|---|
| 8-238426 | 9/1996 | Japan . |
| 8-293111 | 11/1996 | Japan . |

OTHER PUBLICATIONS

Hosaka et al, J. Vac. Sci. Technol., 15(5), pp. 1712–1717, Sep. 1978.

Pending U.S. Pat. application Ser. No. 09/165,637 filed Oct. 2, 1998, Masahiro Hatakeyama et al., entitled "Magnetic Recording Disk and Method of Manufacturing Same".

Primary Examiner—Alan Diamond
Attorney, Agent, or Firm—Wenderoth, Lind & Ponack, L.L.P.

[57] ABSTRACT

It is an object of the present invention to provide a method of making a magnetic disk having a uniform textured structure with micro-waviness of fabrication depth of less than 20 nm, preferably less than 10 nm, and a local depth deviation of less than 5%, in which texture patterns are characterized by the fact that lateral surfaces of the structure are sloped or curved. The object has been achieved in a method for making a magnetic disk having micro-waviness on a fabrication surface of a substrate for reducing dynamic friction and controlling head float, by rotating and irradiating the fabrication surface with a high energy beam from a beam source at an inclined angle to the substrate surface, through a shielding mask having a specific pattern, so as to process a transcription pattern on the substrate surface to produce a textured structure with micro-waviness having sloped or curved side surfaces.

11 Claims, 21 Drawing Sheets

PRIOR ART

PRIOR ART

MAGNETIC DISC AND METHOD OF MANUFACTURING SAME

CROSS REFERENCE TO RELATED APPLICATIONS

This application is based on Japanese Patent Applications serial No. 1997-220,768, No. 1997-220,769, No. 1997-220,770, No. 1997-220,771, all of these filed in Japan on Aug. 1, 1997, and is related to U.S. Pat. No. 5,640,009, and Japanese Laid-open Patent Publication No. 1993-182,787, each of which is incorporated by reference in its entirety.

BACKGROUND OF THE INVENTION

1. Field of the Invention

The present invention relates to magnetic disks used in hard disk drives, for example, and relates in particular to a method of manufacturing magnetic disks having micro-waviness on their surface or a method for fabricating substrates used for such a magnetic disk manufacturing method. Hereinafter, "substrate" refers not only to a base plate itself made of aluminum and glass, but also to such a substrate including any magnetic, carbon, lubricating or Ni—P layer formed on the base plate.

2. Description of the Related Art

With reference to a conventional layered structure of a magnetic disk shown in FIG. 24A, an aluminum substrate material 350 is coated with successive Ni—P layer 352, magnetic layer 354 and carbon layer 356. In response to demands for hardness and precision flatness of the substrate in recent years, a glass substrate has become commercial to replace the Al substrate material, and as shown in FIG. 24B, such a disk is comprised of successive magnetic layer 354 and carbon layer 356 coated on a surface of a glass substrate material 360.

In order to obtain a high data density, hard disk drives are used by floating a magnetic head on the disk surface at a so-called "semi-contact" state with minimum possible separation distance therefrom, so that a high precision in surface flatness is required on the disk. On the other hand, an excessively flat surface may cause head sticking, and is not desirable. For this reason, it is preferable for the disk surface to have a certain degree of fine roughness, or micro-waviness.

In conventional techniques for aluminum substrates, micro-textured structures are fabricated on a Ni—P layer formed on the substrate surface by using such mechanical methods as abrading with an abrasive tape or abrasive cloth as well as physical treatment such as laser irradiation and bombardment with high energy ions. For glass substrates, texture fabrication techniques include sputtering with hydrofluoric acid vapor or surface crystallization, in addition to laser or high energy ion irradiation.

SUMMARY OF THE INVENTION

However, mechanical abrading methods using abrasive tapes and cloths are not suitable for making such high-precision micro-waviness of less than 10 nm height with a variance of less than ±5%, because of limitations due to deviation of abrasive grain size or contact pressure. On the other hand, laser abrasion technique suffers from variations in micro-texture heights, caused by non-uniformity in laser spot size and intensity as well as temporal variations in laser intensity inherent in laser generators. Also, due to its pit-by-pit process, high density texturing (e.g., pit density over 1,000,000 per $cm^2$) by laser beam irradiation requires an excessively long exposure time, and the production suffers from high cost and low efficiency due to slowness of the process.

Furthermore, when metals are exposed to an air atmosphere, a natural oxide film layer is formed on the outermost surface. Although the nature of the oxide layer formed varies depending on the material, for Ni—P layer, an oxide layer of about 3~5 nm thickness is formed, causing differences in laser absorption/reflection characteristics for oxidized and non-oxidized surfaces. Laser abrasion texturing is based on a phenomenon of local micro-melting, and because of the differences in melting behavior of the oxidized surface layer and non-oxidized underlayer of Ni—P, such variations are reflected sensitively on the variations in the structure height of micro-waviness produced, and it is virtually impossible to obtain a micro-waviness of an even height. Furthermore, with the laser-texturing process it is difficult to incorporate precision cleaning in the final production step, so that the yield tends to be low.

Regarding the texture fabrication techniques for glass substrate, such as sputtering with hydrofluoric acid vapor, the process is based on local deviation in vapor adsorption ability of the substrate, therefore etched depths can vary widely because of non-uniformity in concentration and deviations of duration due to difficulty in controlling the fabrication time. Therefore, non-uniformity increase in surface dissolution depth virtually makes it impossible to produce micro-waviness of a uniform density of less than 10 nm depth over the entire glass substrate.

Regarding the crystallization method for the glass substrate, non-uniformity in heat treatment, crystal size and degree of precipitation are difficult to control and lead to non-uniformity of surface density and depth of micro-waviness. Therefore, it is difficult to control the depth and density variations to less than 5% over the entire surface of the glass substrate.

Regarding the micro-texturing techniques using high energy ions or plasma particles, fabrication is performed by accelerating the ionic particles in an electrical field and bombarding the substrate surface through a masking pattern for texturing. Such masking patterns should be produced by photolithographic techniques, however, it is difficult to produce ultra-fine line or cavity patterns of less than 1 mm size by using conventional photolithographic techniques. Furthermore, the mask making process suffers from many inherent problems, such as the complex nature of the steps, wet cleaning using alcohol and water, and the necessity for subsequent drying and a need for precision drip-sputtering equipment, all of which represent significant barriers to lowering the production cost and improving the productivity.

Techniques such as dissolving particles in alcohol, stirring and dripping onto the substrate to disperse the particles suffer from the problems of aggregation of particles caused by surface tension effects upon solvent evaporation and the resulting variations in local distribution density of particles. In some extreme cases, particles may even contact each other and cause severe local disturbances in particle distribution density.

It is an object of the present invention to provide a method of making a magnetic disk having a uniform textured structure with micro-waviness of fabrication depth of less than 20 nm, preferably less than 10 nm, and a local depth deviation of less than 5%, in which texture patterns are characterized by the fact that lateral surfaces of the structure are sloped or curved.

The object has been achieved in a method for making a magnetic disk, having micro-waviness on a fabrication surface of a substrate for reducing dynamic friction and controlling head float, by rotating and irradiating the fabrication surface with a high energy beam from a beam source at an inclined angle to the substrate surface, through a shielding mask having a specific pattern, so as to process a transcription pattern on the substrate surface to produce a textured structure with micro-waviness having sloped or curved side surfaces.

The rate of material removal in a shielded region is slower than that in a region under constant exposure to the beam so that irregularities with sloped or curved side surfaces can be produced by contour transferring, produced by irradiating at an inclined angle or rotating the substrate. Irradiation angle is not particularly limited and can be chosen according to the type of profile desired. To effect uniform material removal over all of the fabrication surface, the beam source should be of a type to radiate an equal amount of energy over the entire fabrication surface. To obtain a uniform profile of the sloped or curved side surfaces, the beam source should produce a beam of high and uniform directionality.

Energy beams may include an electron beam, ion beam, laser beam, X-ray beam, fast atomic beam, atomic beam and molecular beam. For example, when a fast atomic beam is applied, material suitability and fabrication parameters vary depending on whether the fabrication surface is a substrate or a coating layer applied on a substrate. Base plates may be divided broadly into two groups: metals and insulators. In the case of metals, disks typically comprise an aluminum base with a Ni—P coating, and in the case of insulators, disks typically include a glass base with a carbon coating. Thickness of layers ranges 10~20 mm for a Ni—P coating and 10~25 nm for a carbon coating.

Considering a case of a textured structure of less than 20 nm height or preferably less than 10 nm, it can be seen that a surface oxidation layer plays a significant role on fabrication characteristics. The thickness of a natural oxide layer is 10~20 nm for an aluminum substrate and 3~5 nm for a Ni—P layer. Therefore, in the present invention, a fast atomic beam is recommended for precision fabrication of non-conductive base, non-conductive coating or metallic base including non-conductive oxidized surface layer.

Fast atomic beam (FAB) has an energy of more than several tens of eV and is comprised by electrically neutral atomic and molecular species. Normally, they are used in a range of energies of several hundreds eV to about 10 keV. Using such a FAB, charge accumulation on electrically non-conductive substrates can be kept to a minimum level, because of the neutral nature of the beam, thereby permitting uniform radiation to be applied even on non-conductive substrates. It follows, therefore, that not only a highly non-conductive surface such as a carbon layer or glass base, but an aluminum surface including an oxidized layer or Ni—P layer, can be fabricated to produce a textured structure of uniform height over the entire surface of the substrate.

Fabrication precision and film layer quality are highly sensitive to the extent of fabrication carried out. As described earlier, the carbon layer used in these cases is 15~20 nm thick, and the oxidized layer is 3~5 nm thick on the Ni—P layer, and 10~20 nm thick on the aluminum base plate. Therefore, resulting properties such as quality of the layer or roughness of the processed surface are significantly different between cases where the removal thickness is 10~20 nm and less than 10 nm even when fabricating the substrate using FAB.

Also, the carbon coating used in these cases is a diamond-like carbon coating of 15~20 nm thickness, and is hard and electrically non-conductive. Therefore, such non-conductive property has great affect when removing 10~20 nm of the substrate or less than 10 nm. Because the non-conductive layer thickness remaining when processing 10~20 nm thickness is very thin, even with the use of a fast atomic beam, it is necessary to control charge buildup on the non-conductive layer by appropriate control of the power of the radiation and neutralization factor so as to prevent dielectric breakdown and accompanying deterioration in the layer property. On the other hand, for performing fabrication of less than 10 nm, fabrication is greatly affected by non-uniformity in beam power, and it is usually very difficult to fabricate a structure without degrading the surface roughness. Therefore, when fabrication depth is less than 10 nm, it is important to strictly control the neutralization factor and beam power even with FAB.

Regarding the technique of fabricating a carbon substrate, if a reactive gas of low reactivity is used, film quality may change or be degraded because the layer is thin and interlayer mixing and infiltration of elements may occur. To perform precise and efficient fabrication of carbon layer of 10~20 nm thickness or less than 10 nm while avoiding such undesirable effects, it is preferable to use process the layer by applying physical sputtering with the FAB based on an inert gas such as argon.

When aluminum is fabricated in the range of 10~20 nm, fabrication will be carried out in the oxidized layer and its boundary to the unoxidized bulk material. If the boundary is present or the boundary area is not of a uniform thickness, non-conductive property and fabricability will vary during the fabrication process. Therefore, efforts must be made to minimize such boundary effects by using physical sputtering techniques using inert gas to avoid local variation effects in the boundary area even when using FAB. If the fabrication depth is less than 10 nm, processing will take place within the non-conductive layer, and the danger of charge accumulation becomes even greater. Also, because so little material is removed, the fabrication of the layer is very sensitive to non-uniformity in beam power, and because the initial surface quality is not to be degraded, uniformity in beam power and neutralization factor must be strictly controlled, even for FAB.

For a Ni—P layer, the oxide layer thickness is 3~5 nm, and Ni itself has a low reactivity; physical sputtering plays a primary roll in the fabrication so as to avoid charge accumulation effects. Compared with the fabrication of 10~20 nm, the oxide layer greatly affects the results with a fabrication of less than 10 nm, because the fabrication straddles a non-conductive oxide layer and a conductive bulk layer. Therefore, even with FAB, it is necessary to control the adverse effects of the boundary region. For example, a physical method such as sputtering with argon based FAB is preferred.

For fabricating a glass substrate, material is always removed from an non-conductive substrate, and FAB is more advantageous for avoiding adverse effects of charge accumulation. Processing of glass substrates can be performed using fluorine gas or fluorine compound gases such as $SF_6$ and $CHF_3$, which are reactive to glasses. Because of their high reactivity with glasses, chemical sputtering is more efficient compared with other reactive type gasses. Compared with rare gases such as Ar, the material removal rate is much faster. In addition to fluorine and fluorine compound gases, a mixture of rare gas and reactive gas can be used to provide both physical and chemical sputtering effects, which is useful when chemical sputtering alone is not adequate. It is obvious that gasses other than fluorine can be used so long as it is reactive with glass material. If the processing depth is less than 10 nm, it is necessary to provide a strict control over the neutralization factor and beam distribution uniformity.

Regarding the source for fast atomic beam (FAB), those disclosed in U.S. Pat. No. 5,640,009, and Japanese Laid-open Patent Publication, 1993-182787, for example, can be used. The features of the FAB disclosed are that control over the linearity and neutralization factor is simple, and the energy density is highly uniform across the beam. Neutralization factor, linearity and distribution of beam energy are highly dependent on the type of FAB source, and it is not possible to produce a textured structure with micro-waviness of uniform quality using a FAB source of poor quality.

Fabricability is different for different combinations of substrate material and the type of FAB used. Therefore, the type of gas to be used in the FAB source must be chosen with care. Types of gas useable for FAB can be divided into two broad categories: (1) inert gases such as argon, and (2) gases which are reactive to the substrate material.

Inert gases are effective for precision fabrication of less than 10 nm depth using only a physical method such as sputtering. Because reactive gases are not used, the apparatus can be economized, and low cost production is possible, particularly for non-reactive materials.

When FAB is used with reactive gases, selection can be made as follows. For carbon, suitable gases are chlorine gas, chloride compound gases, fluorine gas, fluorine compound gases, and oxygen. Vapor pressures of reaction products between carbon and chlorine, fluorine and oxygen are relatively higher compared with other gases, so that chemical sputtering can be used to remove a carbon layer.

Also, such gases may be used in combination with other gases so that a mixture of argon/chlorine or chlorine compound gas, argon/fluorine or fluorine compound gas, or argon/oxygen can be used to perform physical as well as chemical sputtering. This approach is useful when chemical sputtering alone is not effective.

Glasses are reactive with fluorine and fluorine compound gases. Vapor pressures of products of such reactions are relatively higher than other gases, and effective fabrication can be performed by chemical sputtering. Combination of physical and chemical sputtering uses a mixture of argon and chemically reactive gases, and such an approach is useful when chemical sputtering alone is not effective.

For fabrication of the aluminum substrate, the sublimation characteristics of reaction products become important, and in this respect, efficient fabrication can be effected using chlorine-based compounds of aluminum which have relatively higher vapor pressures. Reaction products between aluminum and chlorine are sometimes difficult to sublime, depending on the fabrication conditions. In such cases, the aluminum surface can be heated using a lamp, for example, to raise the temperature of the substrate surface including reaction products thereon to increase its reactivity, so as to permit the use of chemical sputtering. A mixture of argon and chlorine and chlorine compound gases can be used to provide physical as well as chemical sputtering effects. This approach is useful when chemical sputtering alone is not effective.

Ni generally shows low reactivity with gases, but chlorides of Ni have relatively higher vapor pressures, and are applicable in chemical sputtering of Ni—P layer. Vapor pressures of reaction products between P and chlorine are high and efficient sputtering can be effected. Ni—P reaction products are sometimes difficult to sublime, depending on fabrication conditions, and in such a case, the Ni—P surface can be heated with a lamp for example to raise the temperature of the substrate surface including reaction products thereon, to increase its reactivity. Such mixed use of physical sputtering and chemical sputtering using chlorine and chlorine compound gases is effective when chemical sputtering alone is not adequate.

Magnetic disks made by such carefully controlled fabrication processes are high density data storage devices having a micro-textured structure on their surface. The sloped or curved shape of the textured structure reduces the contacting surface area to provide an efficient repair of damage of the surface as well as reduces dynamic friction between the head and the substrate surface to provide good lubrication. On the outermost surface of the disk is applied a several nanometer thick lubrication layer, and such a lubrication layer comprises a liquid film covering the micro-sized textured structure. When the magnetic head touches the disk surface, the lubrication layer can be easily disturbed. It is important that such a disturbed lubrication layer be self-repairing on the magnetic disk, and this self-repairing action is facilitated when the texture has a sloped or curved side wall shape, rather than steep or at right angles.

A Ni mask made through an electroforming process or a dry- or wet-etched Si mask are used for shielding. Especially, masks having cavity patterns of a high aspect ratio are best made by, first, making a mold by processes such as LIGA process or laser LOGA process, and then molding Ni metal into the mold. A radioactive ray such as a soft X-ray or ultraviolet ray is used to make a photoresist mold, which is then used for Ni electroforming, thereby making a mask with a high aspect ratio and micro sized pattern.

The shape of the shielding mask is crucial in determining the height of the micro-textured structure, which should preferably be less than 10 nm. This is because a minute floating distance between the magnetic head and the disk enables the bit size in the magnetic layer to be made smaller in a quadric order to obtain ultra-high density data storage. To produce an efficiently functioning head while preventing sticking, it is essential that the height of the textured structure be less than 10 nm.

In one aspect of the invention, micro-particles can be preferably used for shielding. Using photoresist patterned masks made by conventional photolithographic techniques will raise the cost because of the complexity of the process and lengthy processing times. The present invention enables production of a shielding mask by placing micro-particles directly on the substrate, so that micro-waviness can be produced uniformly in a short time over the entire surface of a fabrication surface.

For example, when such micro-particles are used on a carbon layer with a FAB radiation, contours of individual particles are accurately transferred on the fabrication surface. Micro-particles in such applications are produced by dispersing alumina particles in a solvent such as alcohol and stirring them with ultrasonic vibration to obtain a uniform dispersion. The solution is then dripped onto a substrate and is spinned, or the solution is dripped while the substrate is spinning to disperse the particles on the fabrication surface. Alumina is chemically stable and exhibits a low sputtering factor in physical and chemical sputtering processes. Therefore, the particle size remains stable under FAB sputtering, and re-deposition of sputtered particles is also extremely low so that surface roughness of the fabricated surface is not deteriorated. For example, elements such as silver have a high sputtering factor, and such substances must not be contained in the particles. Careful selection of particle material allows successful contour transferring without detrimentally affecting substrate surface roughness.

Other advantages of using alumina particles are that dispersion in a liquid can be obtained without using a surface activation agent, and that, after FAB sputtering, the particles are removed from the fabricated surface very easily by ultrasonic cleaning using alcohol. Depending on the nature of the micro-particles used in the shielding mask, it may sometimes be necessary to use a cleaning solution containing a surface activation agent, or it may be difficult to remove particles because of increased bonding due to the effects of FAB radiation.

It is preferable that micro-particles be crystalline made by CVD. Such crystal grown alumina particles are preferable because of a narrow distribution of particle sizes and relatively uniform diameters. Also, compared with sintered alumina products, less impurity is included so that there is less deterioration of surface rougheness caused by re-deposition of sputtered impurities.

Furthermore, crystallized alumina particles generally do not form clusters as they do in sintered particles, so that well separated spherical or elliptical particles can be produced. A smooth exterior outline of the particles results in smooth contour transferring of textural patterns. Friction reduction can be more effective for smooth profiled textural patterns, because debris from sliding surfaces are sometimes accumulated in the crevices formed by clustered profile patterns.

The combination of alumina micro-particles with FAB sputtering as described in the present invention enables high precision fabrication of a micro-textured structure of uniform quality over the entire surface of a substrate. Micro-particles other than alumina can be used, including carbon group substances such as diamond, graphite as well as compound substances such as $Si_3N_4$, SiC, TiN, $ZrO_2$, and MgO.

Fabrication may be performed directly on a base plate or on any of the layers, such as Ni—P, a magnetic layer and a carbon layer formed on the base plate.

Another aspect of the present invention is a method for fabricating a micro-textured structure on a fabrication surface of a substrate, to reduce friction between the substrate and a magnetic head as well as to adjust the floating distance of the head, comprising dispersing micro-particles from a micro-particle source into a gaseous atmosphere; settling and attaching dispersed micro-particles on the fabrication surface; and irradiating a high energy beam on the fabrication surface so as to transfer a pattern of the micro-particles.

Accordingly, micro-particles can be dispersed uniformly over the fabrication surface, and by irradiating an energy beam through the particle masking, contour transferring of dispersed pattern can be replicated precisely on the fabrication surface.

Because the micro-sized particles are dispersed into a gaseous atmosphere, there is no particular limitation to the size of the substrate to be processed by the technique so that 2~12 inches (50~300 mm) diameter substrate can be processed. A plurality of substrates can be processed at the same time. Because wet processes using water or alcohol are not used, drying steps and precision dripping devices are not required, so that the process is simplified. Especially, when evacuation steps are involved before or after the dispersion step, the whole process can be done through dry processes without involving a wet process, thereby reducing number of steps and production cost.

Micro-particles suitable for the dispersion process are crystallized alumina particles made by CVD, or quartz particles of high sphericity. Such particles in size ranges of 0.1~10 mm are easily obtainable. Also, such particles of alumina or quartz can easily be removed from the fabricated surface after fabricating with FAB, ion beam or plasma. Other applicable micro-particles include, diamond, graphite, carbon, $Si_3N_4$, SiC, TiN, $ZrO_2$ and MgO.

Use of energy beams for fabrication is advantageous because of excellent directionality of the beam, which produces faithful replication of the particle profile by contour transferring. Especially, as explained earlier, FAB is advantageous because of the special properties of the beam.

A gas may be used to disperse micro-particles by first uplifting the particles into the dispersion atmosphere and then settling them down onto a fabrication surface. This type of gas flow pattern can be generated by dividing the dispersing chamber with a partition, which has an opening at an upper area, into two rooms and placing a particle source and a substrate on a lower section in each room.

Division of the dispersion space into two rooms with a partition generates several features. First, larger particles ejected into the space above the particle source settle down quickly and are not able to go over the partition so that they cannot settle on the substrate. Those particles of much smaller sizes can fly over the partition with the air stream, but are blown away further than the substrate so that they too do not settle on the substrate. In this case, the partition acts as a classifier. Particles of a given size range are dispersed over a large space and produce a uniform deposit on the fabrication surface. By controlling the pressure of the gas stream, spray direction, flight time, spray frequency and settling time, the settling density of particles accumulated on the fabrication surface can easily be adjusted.

Methods for improving the uniformity of density of settled particles include the use of turbulent flow generated by increasing the number of nozzles or multi-directional spray. Arrangement of the container for particles includes such configurations as separating the particle container from the substrate with a partition, or, a double-walled cylindrical container having the substrate disposed within the inner wall and the particle source disposed between the inner and outer cylinders so that the inner cylinder acts as a partition to provide a multi-directional spray.

The dispersion step may be carried out by jetting a gas stream against the particle source. Spray gas can be dry air, nitrogen or argon gas. Pressured gas contained in a pressure container is directed to the particles through a valve and a nozzle for a certain duration so as to eject the particles into the dispersion atmosphere. By controlling the pressure, duration of spray and distance to the substrate suitably, a uniform density of particle dispersion in a space of a large size can be created, for example over a substrate surface of 2~12 inches in diameter.

The process of dispersion may be carried out by applying ultrasonic vibration to the particle source. Ultrasonic vibration separates agglomerated particles in the source and ejects particles of a uniform size into the dispersion atmosphere so as to settle particles of a uniform size on the fabrication surface. This is because the mass of the particles is very small so that it can disperse with a small fluid force caused by the vibration. It also creates a dispersion of particles of almost the same size.

The combination of ultrasonic vibration and gas spray simultaneously will increase the dispersion density in the atmosphere. Vibration may be applied to the substrate itself so as to disperse the particles settled on the fabrication surface. By directing ultrasonic vibration from speakers to the atmosphere, further separation of particles may be effected to produce an even more uniform settling density of the particles on the fabrication surface.

Another method includes an electrode on which particles are placed, and an electrical field is impressed between the electrodes and the substrate placed at a certain distance from the particles on the electrode. Particles are attracted towards the substrate and are dispersed on the fabrication surface. The electrical field can act as a further force for separating the particles suspended in the atmosphere.

The space between the substrate and particles may be impressed with an alternating current field or a high frequency field to separate the particles suspended in the atmosphere to obtain a uniform settling density. According to this method, the electrical field provides a separation force for agglomerated particles suspended in the atmosphere.

By applying the method of the present invention, a high density magnetic disk having a textured structure with micro-waviness, for control of friction and head float, may be produced efficiently at low cost. In the case where a base plate for the substrate is an aluminum alloy or glass material, by fabricating the textured structure directly on the base plate, and by subsequent coating of magnetic layer or carbon and the like which reproduce the contours of the textured structure of the base plate, it is possible to produce a magnetic disk in a simple overall process. The textured structure may be formed on the base plate directly or on any overlaid coating layers.

When the magnetic disk is made of an aluminum base plate, a Ni—P layer can be overlaid extremely flat, so that the textured structure can be accurately reproduced on the Ni—P layer. When the structure is fabricated on a carbon layer (diamond-like carbon), precision cleaning is performed at the final production step so that adverse effects caused by adsorption of dust particles can be minimized to thereby improve the yield at low cost. By forming subsequent layers of carbon and lubrication layers after the Ni—P layer is precision cleaned, further cleaning can be omitted so as to simplify the process and reduce the production cost. The same procedure can be applied to glass substrates.

An other aspect is a method for making a magnetic disk having a textured structure with micro-waviness on a fabrication surface of a substrate for reducing dynamic friction and controlling head float, comprising forming a shielding mask comprised of a thin carbon layer of a specific pattern on the fabrication surface of the substrates and irradiating the substrate with a high energy beam so as to transfer the specific pattern of the shielding mask onto the fabrication surface.

Using this method, it is possible to fabricate a micro-textured structure (of less than 20 nm height or preferably less than 10 nm) on any outermost surface of a magnetic disk, that is, carbon layer, Ni—P layer, glass substrate or magnetic layer, uniformly over the fabrication surface in a short time, with a local deviation in processed depth of less than ±5%. The entire process consists of dry steps only, so that wet cleaning steps are not required, thereby avoiding problems of low yield associated with wet cleaning.

By controlling the thickness of the carbon layer (to be formed and fixed on the fabrication surface) in accordance with a target height of the structure, substrate and carbon layer dissipation speed, and by continuing to irradiate with the high energy beam until the carbon layer is eliminated, it is possible to produce a micro-textured structure of less than 20 nm height and preferably less than 10 nm height.

By forming the carbon layer to be thicker than above and by making the processing depth less than 20 nm or less than 10 nm with an energy beam, the height of the structure may be made to be less than 20 nm or less than 10 nm. The residual carbon layer on the fabrication surface may be removed by using an oxygen based high energy beam.

FAB, as a form of high energy beams, can fabricate any layer such as glass surface, Ni—P layer, magnetic layer (including sub-layer), or carbon layer. FAB is comprised of an electrically neutral beam of atoms or molecules with energy of more than several tens eV, and usually with energy levels of several hundred to 10 keV. FAB thus is able to fabricate without producing charge accumulation on the non-conductive layer, and allows uniform irradiation to be carried out on the fabrication surface no matter how the charge accumulation is.

The carbon layer may be formed by irradiation of an electron beam. The carbon layer may be formed by decomposing a carbon source, such as an organic gas, introduced into a vacuum environment on the fabrication surface with the electron beam.

Carbon decomposition may be produced on the fabrication surface at the site of electron bombardment by operating an electron beam at 1~10 keV to decompose a gaseous carbon source introduced into a vacuum environment. A carbon source in this case may be derived from soot, graphite or diamond-like carbon depending on the organic gas, the gaseous component incorporated in the vacuum environment and the energy level of the electron beam. Organic gas may include hydrocarbon ($C_mH_n$) gases such as methane, propane, and vapors obtained from a liquid solvent such as alcohol or ketone. Other gaseous or liquid volatile substances including carbon which can be decomposed by electron beam to form a carbon layer are obviously applicable.

When the vacuum system is operated using an oil based pump, such as an oil diffusion pump, oil vapors and other decomposition volatile products from the pump can backstream through reverse diffusion into the processing chamber and adhere on the fabrication surface and are decomposed by the electron beam to produce a carbon layer. In such a case, introduction of organic gas may be decreased or eliminated totally.

The thickness of the deposited carbon layer can be controlled by adjusting the electron beam power and the amount of organic gas supplied to the fabrication surface. If the power density per unit cross-section is excessive, the substrate temperature increases and has an effect of decreasing the possibility of carbon adhesion so as to decrease the carbon deposition rate on the surface. Therefore, the range of electron beam power should be limited to a lower side of the above mentioned permissible power range. Power levels less than 1 keV, where the carbon deposition occurs, are useable but the current density is low and the carbon deposition rate is decreased.

The carbon layer may be produced by irradiating the electron beam through a shielding mask having a certain pattern formed thereon. Electron beam sources should be selected so that the beam width is about the same as the substrate diameter, and select the shielding mask accordingly. This process quickly provides carbon layers with contour transferring of the pattern onto the fabrication surface. The carbon deposition process is based on the same principle presented above. The shielding mask may be a mesh type or electroformed metal strip such as Ni having cavities of 5~several tens of micrometers separated at distance of several to several hundred micrometers, or Si having a similar pattern produced by anisotropical wet etching or plasma etching techniques.

The carbon layer may be produced by electron beam scanning in a regular or irregular arrangement pattern. Electron beam can be swept at fast speeds electromagnetically or made stationary to produce any pattern quickly to produce any regular or irregular patterns on the fabrication surface at a short period to generate carbon layer on the substrate surface. Width of the line and size of a spot of the carbon layer pattern, for example, can be controlled by adjusting the electron beam diameter with electromagnetic lenses. For example, the electron beam diameter can be adjusted from several tens of nanometers to several hundred micrometers so that the lines or spots of the same size are obtainable.

The carbon layer may be produced through vapor deposition process by depositing carbon vapor generated from a vapor source onto the fabrication surface through a patterned mask. By suitably combining a mask and carbon layer generating device such as carbon vapor source, a regular patterned carbon layer may be formed and fixed on the fabrication surface. The shielding mask can be the same as those described above, and is placed on top of the fabrication surface to deposit carbon atoms (or carbon clusters) from the carbon vapor source to thereby replicate the pattern of the mask.

Here, it should be noted that, because the melting point of carbon is high, normal heating type vapor sources are inapplicable, so that arc discharge type vapor sources or a deposition method called "sputtering" may be used. The sputtering deposition method can be performed by using a sputtering gun, or sputtering chamber including a mask and a substrate, or a CVD method. These methods have the advantages of being applicable to non-conductive materials, compared to the above-described method using electron beams, so that a glass material surface or carbon layer can be used as a substrate.

Another aspect is a method for making a magnetic disk having a textured structure with micro-waviness on a surface of a substrate for reducing dynamic friction and controlling head float. The method comprises irradiating a fabricating surface of the substrate with a high energy beam to generate a sputtered substance, to thereby form the textured structure by re-deposition of products generated by mutual interaction of the sputtered substance with the high energy beam and/or the fabrication surface.

When a substrate surface is irradiated with a high energy beam, sputtering is produced, but reaction products having poor sublimation characteristics are difficult to remove through the evacuation of vapors. Such substances in the liquid form are condensed on the irradiated surface to form surface textures comprised of spherical or spheroid shape due to the surface tension effects, and are further cooled to be coagulated on the surface. Such process produces a textured surface of a certain depth depending on the sputtering condition, etc. A FAB source is suitable as an energy source as described earlier.

It is preferable to first place a substance to be sputtered on the fabrication surface prior to irradiating. Since the substrate material may not always cause easy re-deposition, a material made of a poor sublimation substance formed into a suitable shape can be disposed on the fabrication surface. By adopting this procedure, the nature of the fabrication surface does not limit the process, so that any type of surface comprising a magnetic disk may be selected to form a micro-textured structure.

A substance to be sputtered may be selected to show a good re-deposition ability inherently, or as a result of reaction with an energy beam as well as with the substances including the substrate.

Since an island-patterned micro-textured structure is desirable, the configuration of the sputtered substance to be disposed on the fabrication surface is normally chosen to have a micro-particle shape. However, depending on the operating conditions of the beam and ease of disposition operation, a thin film or a thin film having a certain pattern may be used.

The sputtered substance may contain sulfur. Such a substance will form a sulfur compound when irradiated with a high energy beam to easily produce a micro-texture structure of an island pattern.

The high energy beam may be comprised of a FAB discharged from a chlorine gas based source. Chlorine gas will form compounds such as aluminum chloride with an aluminum substrate or sulfurous chloride with a sulfur-including sputtered substance, thereby producing a micro-textured structure generated through re-deposition process.

Irradiation with a high energy beam may be combined with temperature control of the substrate. This process promotes a compound formation produced between a reactive gas and a substrate material or micro-particles by raising the substrate temperature, and when the substrate temperature is lowered, re-deposition of the generated compound can take place to produce the textured surface.

DESCRIPTION OF THE PREFERRED EMBODIMENTS

Figure 1:
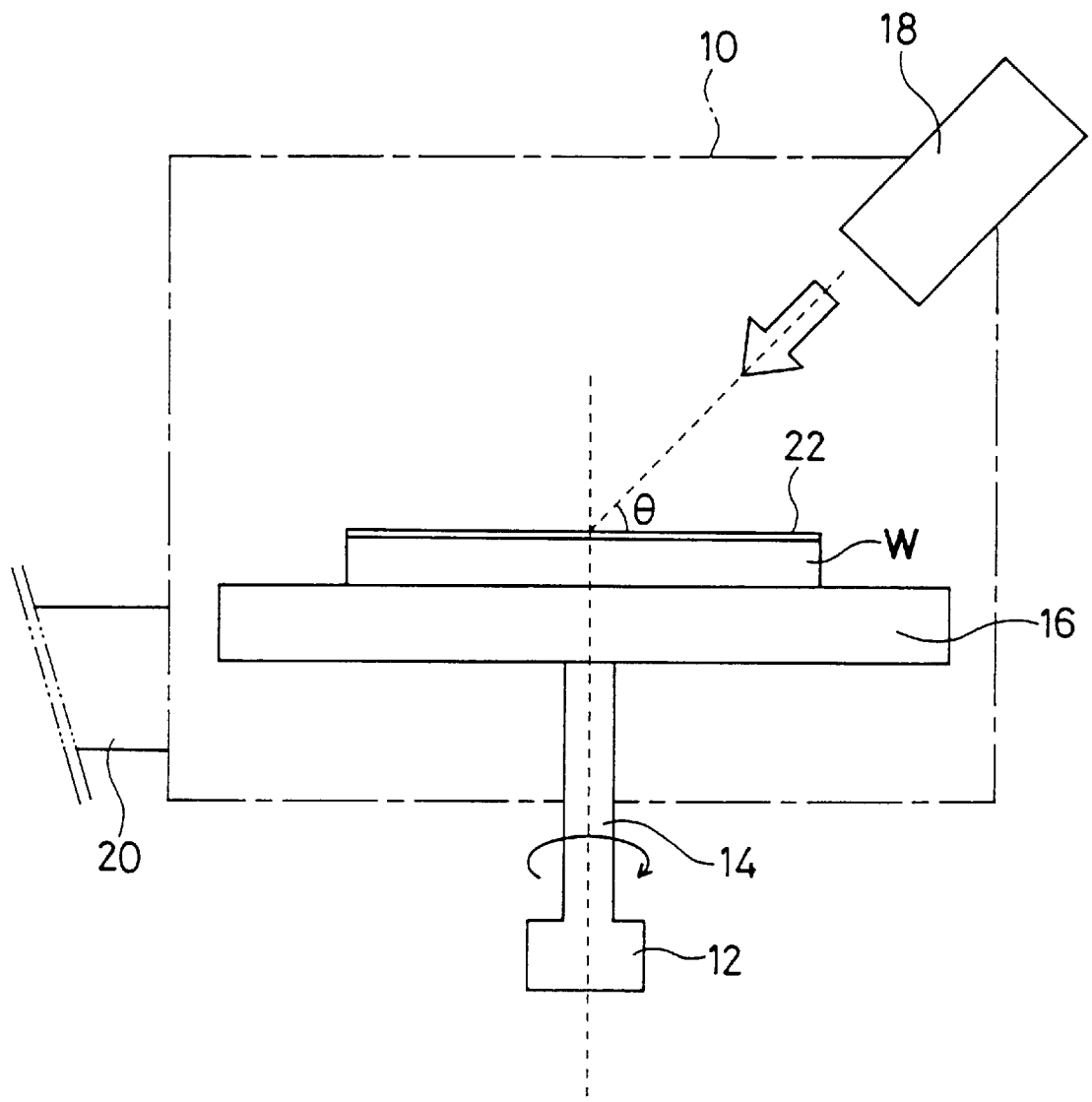
FIG. 1 is a schematic illustration of a first embodiment of the present invention.

A first embodiment of the present method will be presented with reference to FIGS. 1 to 5. FIG. 1 shows a micro-texturing apparatus comprised of a hermetic chamber 10; a rotation stage 16 rotatably/elevatably supported by a shaft 14 which is driven by a drive device 12 located inside the chamber 10; and a fast atomic beam (FAB) source 18 of a parallel plate type, disposed inside the chamber 10 in such a way to radiate a beam at a slant angle to the rotation stage 16. The incidence angle of the FAB to the rotation stage 16 can be varied. The vacuum chamber 10 is communicated with a vacuum pump (not shown) through an evacuation port 20 and a fabrication object (referred to as the workpiece W) is transported through a load-lock chamber (not shown).

In this embodiment, a magnetic substrate W as the workpiece was placed on the rotation stage 16 and a patterned mask 22 was laid over the fabrication surface of the substrate W. The magnetic disk W was an aluminum alloy of 75 mm outer diameter, and both surfaces were covered with successive coatings of a Ni—P layer, a magnetic layer and a carbon layer of 20 nm thickness. Initial surface roughness of the substrate W was less than 1 nm. Textured structure with micro-waviness was fabricated on the carbon layer by placing a patterned mask (shielding) 22 and bombarding the surface with FAB.

Figure 2A:
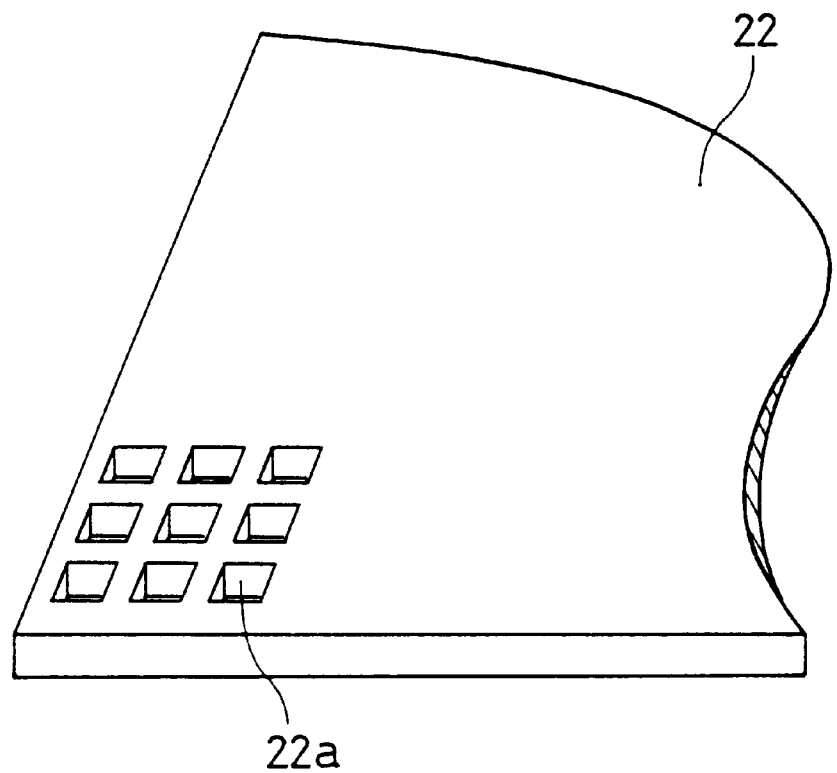
FIG. 2 is an illustration of a masking device.
Figure 2B:
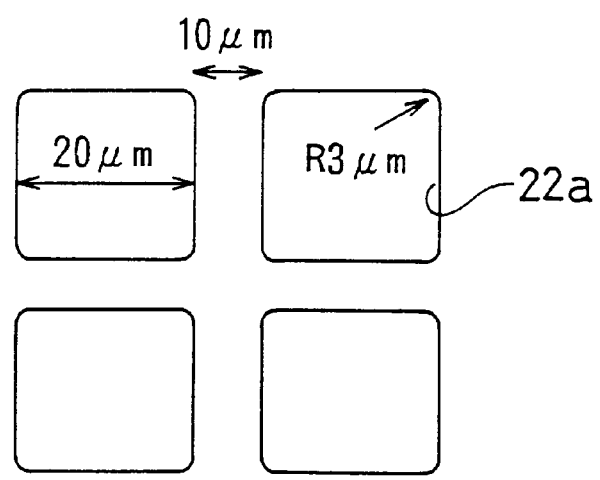

As shown in FIGS. 2A, 2B, the shielding patterned mask 22 was a nickel sheet of outer dimensions of 80×80 mm and 20 mm thickness made into a lattice pattern structure by electroforming. The outer dimension of mask 22 was sufficient to shield the entire surface of the substrate W of a size in a range of 20~130 mm. The size of the square holes 22a formed on the mask 22 was 20×20 $\mu$m and the corners were radiused to 3 mm, and the holes were separated at about 10 $\mu$m. Such a patterned mask 22 can also be fabricated from a Si base plate using a plasma or wet etching technique.

The FAB source 18 was a parallel plate type using argon gas, disclosed in a Japanese Patent Laid-open Publication, 1993-182787, for example. Operating conditions of the source 18 were as follows: beam incidence angle, 45 degrees; stage rotation speed, 12 r.p.m.; bombardment duration, 15 seconds; beam diameter, 110 mm; discharge voltage, 3 kV; discharge current, 300 mA; neutralization factor, approximately 80%. A magnetic field generator is also provided to control plasma density by impressing a magnetic field of 500 gauss.

Figure 3A:
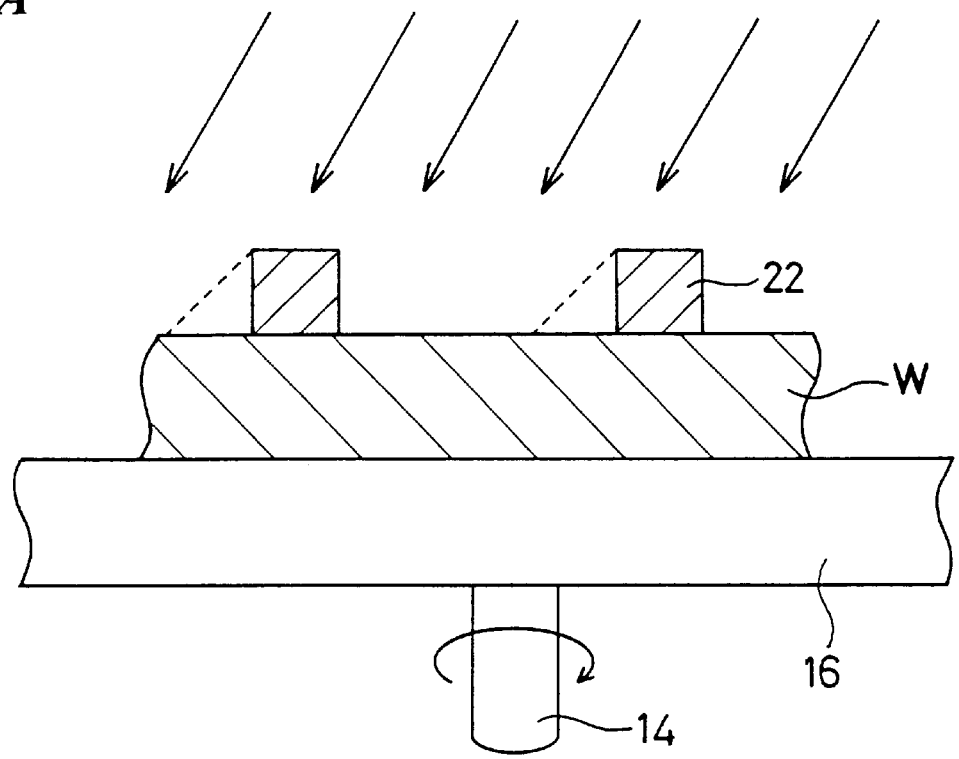
FIGS. 3A, 3B are illustrations of the fabrication process of the first embodiment.
Figure 3B:
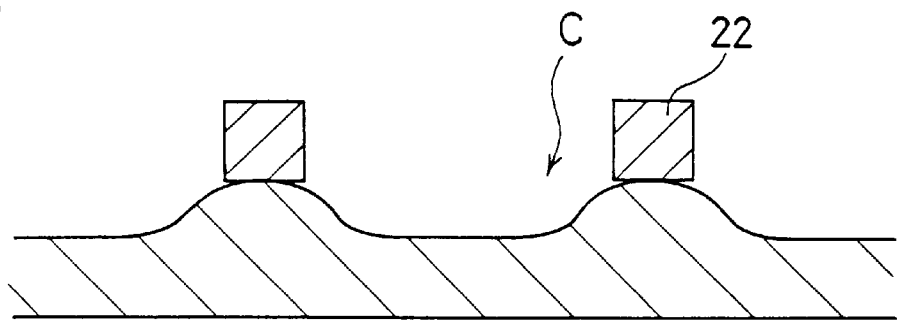

Using a texturing apparatus of such design, and bombarding the rotating substrate W with a FAB at an angle of 45 degrees through the mask 22, as illustrated in FIG. 3A, contour transferring produces a wavy sloped area whose fabricated depth was dependent on the distribution of duration of irradiation according to shadow forming characteristics. Therefore, a given transferred pattern was produced on the fabrication surface as illustrated in FIG. 3B to produce a micro-waviness C of about 8 nm depth, over the entire surface of the substrate W, whose surface roughness was about the same as the initial roughness of less than 1 nm and local depth deviation of less than 5%.

Figure 4:
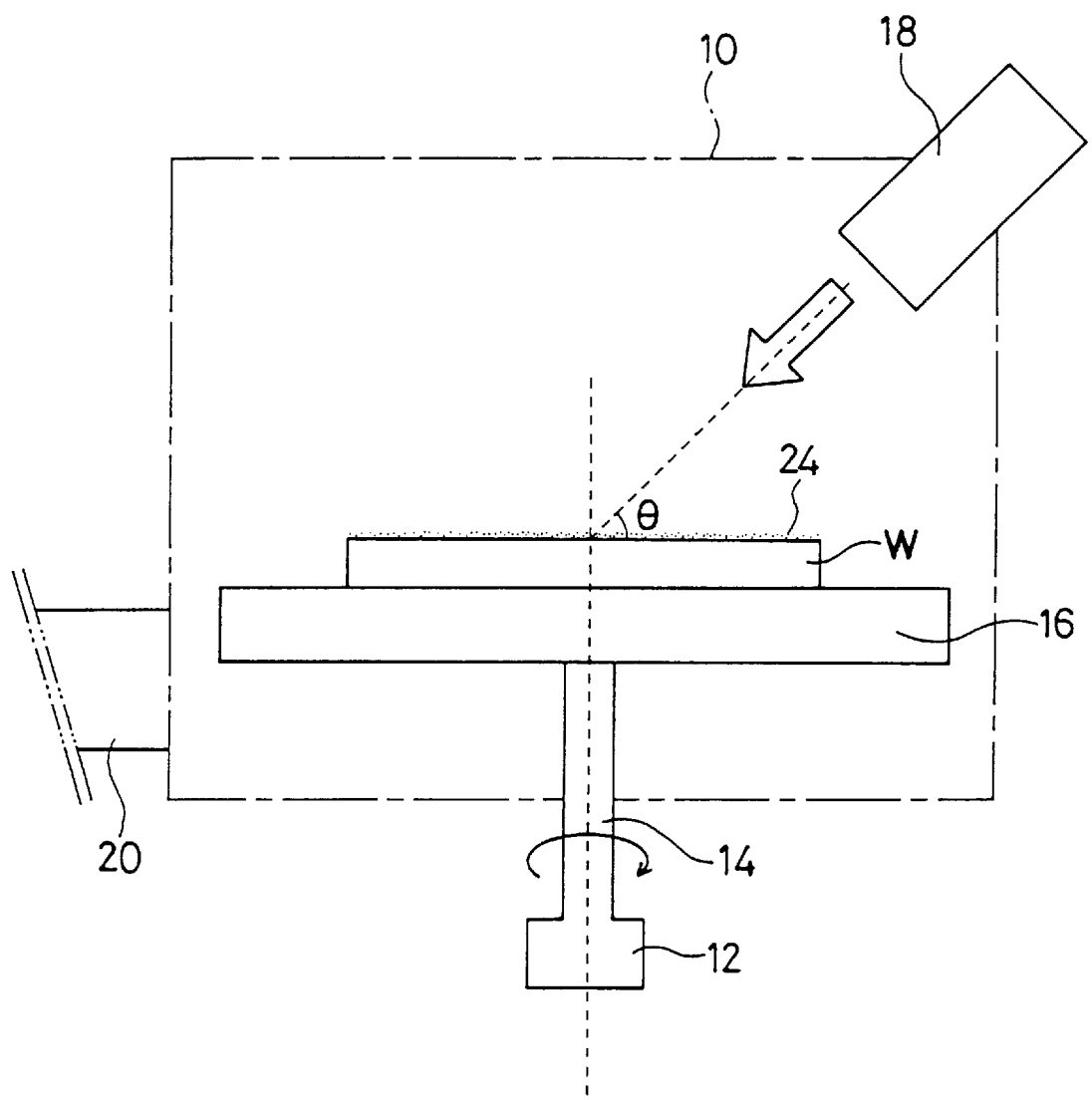
FIG. 4 is a schematic illustration of a second embodiment of the micro-texturing process of the present invention.
Figure 5:
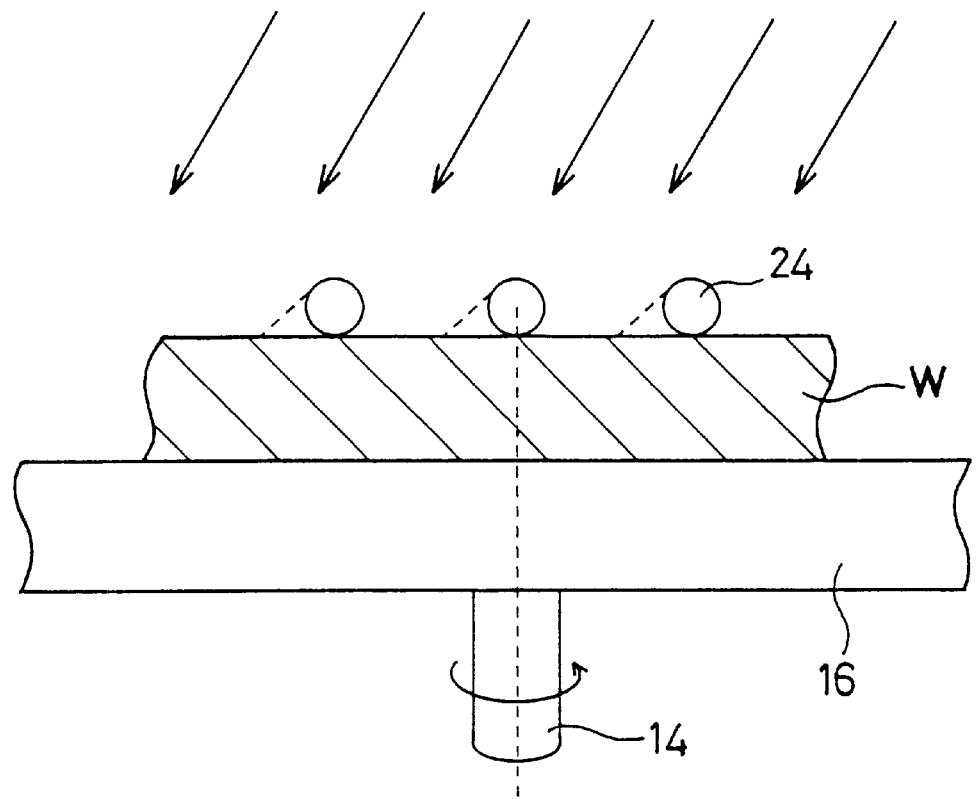
FIG. 5 is an enlarged illustration of the fabrication process of the second embodiment.

FIGS. 4 and 5 show a second embodiment of the texturing apparatus, and in this case, micro-particles 24 of 5 mm diameter of crystallized alumina produced by CVD were used. The process consisted of first dispersing the alumina particles 24 uniformly in ethyl-alcohol solvent by ultrasonic vibration. Then, the substrate W was placed on a rotation controller device and spinned at a relatively low speed of about 200 r.p.m., and a quantity of the liquid containing the micro-particles 24 was dripped onto the substrate W, and then it was spinned at a higher speed of about 5000 r.p.m., to obtain a uniform dispersion of particles 24 on the substrate W at a distribution density of about 12,000 particles/mm$^2$. A parallel plate type FAB source using argon gas was used to irradiate the substrate W with FAB to produce a depth of about 5~20 nm, and the substrate W was washed ultrasonically to remove the particles 24 from the carbon layer.

Texturing was performed under the following two conditions:

(1) beam incidence angle, 45 degrees; stage rotation speed, 12 r.p.m.; bombardment duration, 15 seconds; beam diameter, 110 mm; discharge voltage, 3 kV; discharge current, 300 mA; neutralization factor, 80%; and (2) beam incidence angle, 30 degrees; stage rotation speed, 5 r.p.m.; bombardment duration, 40 seconds; beam diameter, 110 mm; discharge voltage, 1.5 kV; discharge current, 300 mA; neutralization factor, 90%.

Figure 6A:
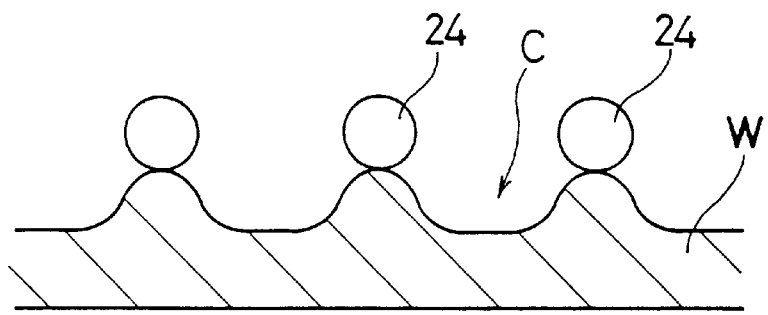
FIGS. 6A, 6B are illustrations of the effects of the process.
Figure 6B:
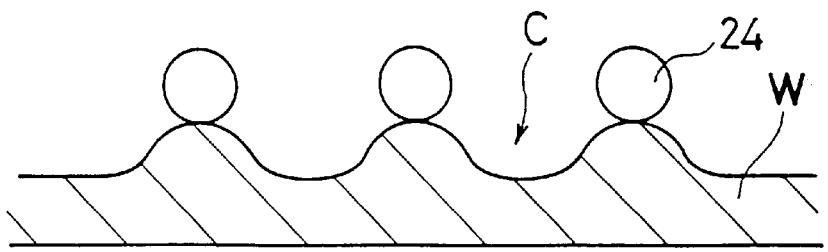

The texture profiles are shown in FIG. 6A for case (1) resulting in a processed depth of 8 nm, and in FIG. 6B for case (2) resulting in a processed depth of 15 nm, respectively. Post fabrication surface roughness for both 15 and 40 second irradiation were the same as the initial surface roughness of less than 1 nm. The difference in the incidence angle produced different fabrication characteristics, and therefore, the extent of the slanted region area was larger for an incidence angle of 30 degrees than for 45 degrees. The fabrication pattern faithfully reflected the profile shape of the crystalline alumina micro-particles 22, and over the entire surface of the substrate W, local deviation in processed depth was less than ±5%.

The glass substrate so fabricated was further processed by precision cleaning, applying coatings of a magnetic layer, a carbon layer and a lubrication layer to produce a final magnetic disk W. Underlying glass surface modulations were replicated on the corresponding outermost surface of the magnetic disk W, thereby providing ultra-high density data transfer as well as efficiently controlling the degree of friction reduction and head float.

Another variation of the second fabrication method was tested using the same micro-particles 24 but different gas particles for the FAB source 18. Micro-particles 24 were produced by the same CVD process, and they were dispersed on a substrate W at a density of about 12,000 particles/mm$^2$. Substrate W was processed by a parallel plate type FAB source 16 using SF$_6$ gas and processed to a depth of about 5~20 nm. Alumina particles 24 were removed thereafter by ultrasonic cleaning.

The parallel plate type FAB source 18 in this case was a type which was disclosed in Japanese Laid-open Patent Publication, 1993-182787. The operating conditions were: beam incidence angle, 45 degrees; stage rotation speed, 12 r.p.m.; sputtering duration, 15 seconds; beam diameter, 110 mm; discharge voltage, 3 kV; discharge current, 300 MA; neutralization factor, 80%. Plasma density was controlled by applying a magnetic field at 500 gauss produced by a magnetic field generator.

The result of irradiation for 15 seconds was the production of textures having a depth of 5 nm. Resulting surface roughness was the same as the initial surface roughness at less than 1 nm. Irradiation was carried out at an angle of 45 degrees through the mask 22, and contour transferring by FAB produced gently sloping side surfaces according to the duration of irradiation according to shadow forming characteristics. Contour transferring of the crystallized alumina particles 24 was accurately replicated, and over the entire surface of the substrate W, local deviation was less than 5%.

Figure 7:
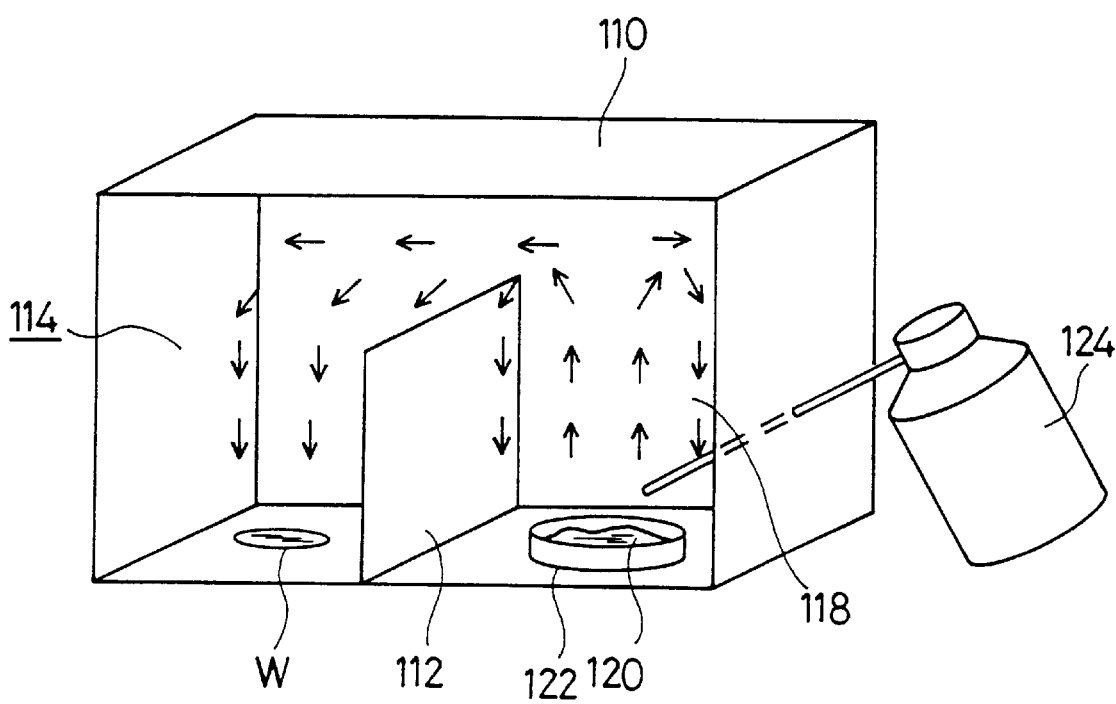
FIG. 7 is another embodiment of the method of the present invention.

FIG. 7 shows another embodiment of the apparatus for making a shield with dispersed micro-particles, comprised of a hermetic particle dispersion chamber 110 with a partition 112 with a top opening, one room 114 of the chamber 110 containing a glass substrate W as the workpiece, an other room 118 containing a particle tray 122 for aluminum particles 120, and a gas spray device 124 for jetting some gas to the particle tray 122. The dimensions of the particle dispersion chamber 110 are 350 mm width ×200 mm length× 350 mm height, and the height of the partition 112 is 300 mm, which is placed 130 mm away from the particle tray 122. The size of the glass substrate W is 3.5 inches (89 mm).

Figure 8:
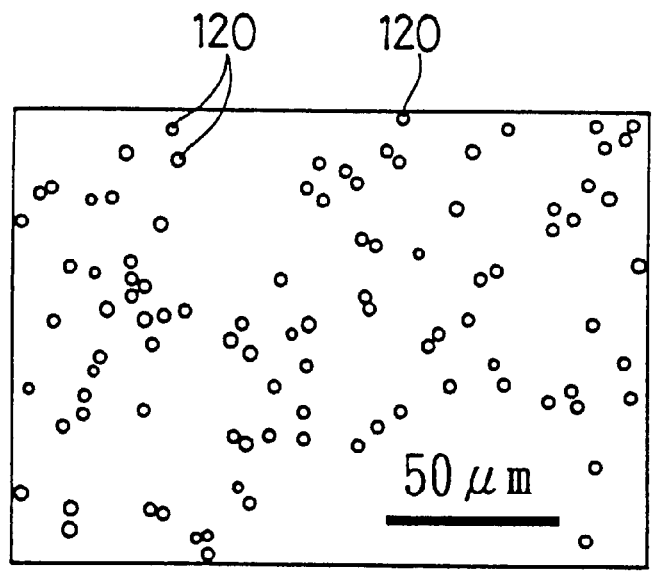
FIG. 8 is an illustration of the distribution of micro-particles in FIG. 7.
Figure 9A:
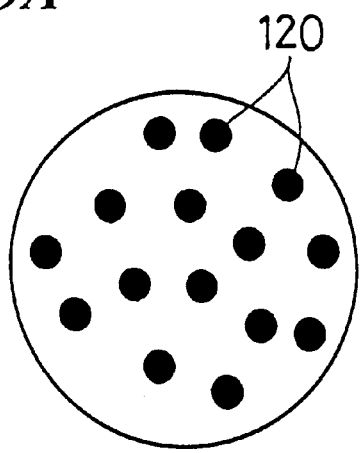
FIGS. 9A, 9B are comparative illustrations of particle distribution patterns in the conventional technique and the present technique.
Figure 9B:
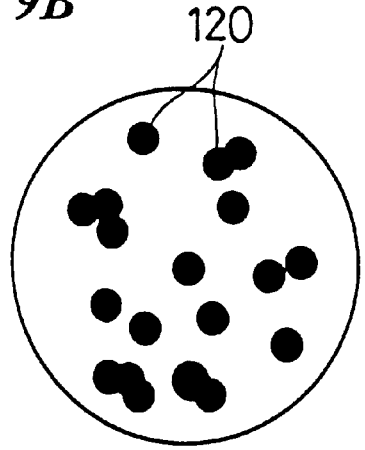

Using this dispersion chamber 110, helium gas from a spray can 124 is directed for two seconds at a pressure of 2 kg/cm$^2$ to the particle tray 122 containing the alumina particles 120, to let the particles 120 fly about. Although the particles become dispersed inside the dispersion chamber 110, larger particles fall quickly and are not able to go over the partition 112 while smaller particles are able to go over the partition 112 but are blown beyond the glass substrate W and are not able to settle on the glass substrate W. Therefore, only those particles of proper sizes are able to fall and settle on the substrate W. An example of a glass substrate W with particles 120 examined under an optical microscope is illustrated in FIG. 8. FIGS. 9A, 9B show a comparison of the settling patterns made by the present method and by the conventional alcohol drop method, respectively.

By adjusting the duration of spray and particle settling time suitably, the amount of particles settled on the glass substrate W can be controlled. It was found that particle settling patterns were not altered by arranging a plurality of glass substrates W parallel or perpendicular to the partition 112. In other words, this technique permits a plurality of substrates W to be processed simultaneously. The same type of deposit pattern was produced for aluminum substrates.

Figure 10A:
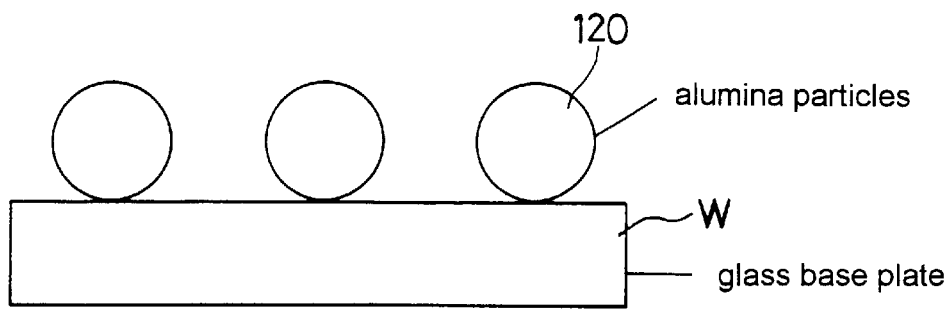
FIG. 10A~10C are illustrations of fabrication steps.

A glass substrate W of 3.5 inches having the particles 120 deposited by the method described above was placed, through a load-lock chamber, on the rotation stage disposed in an fabrication chamber evacuated by a turbo pump and a dry pump. The vacuum chamber was provided with a FAB source disclosed in a Japanese Laid-open Patent Publication, 1993-182787, using SF$_6$ gas. The operating conditions of the FAB source were as follows: irradiation duration, 15 seconds; beam diameter, 110 mm; discharge voltage, 3 kV; discharge current, 300 mA; and neutralization factor, 90%. Plasma density was controlled by applying a magnetic field at 500 gauss from a magnetic field generator. After irradiating the substrate W with FAB to the surface, as illustrated in FIG. 10A, the alumina particles 120 were removed by ultrasonic cleaning to produce a substrate shown in FIG. 10B.

Figure 10B:
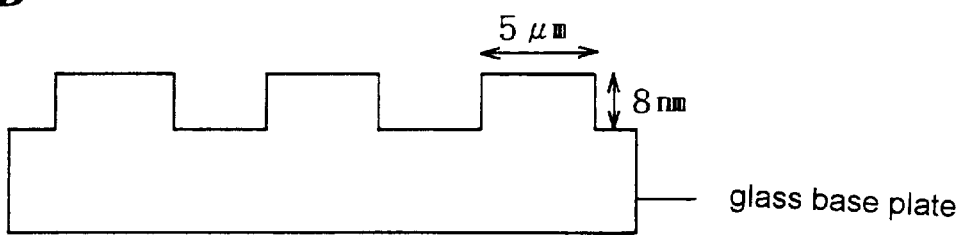
Figure 10C:
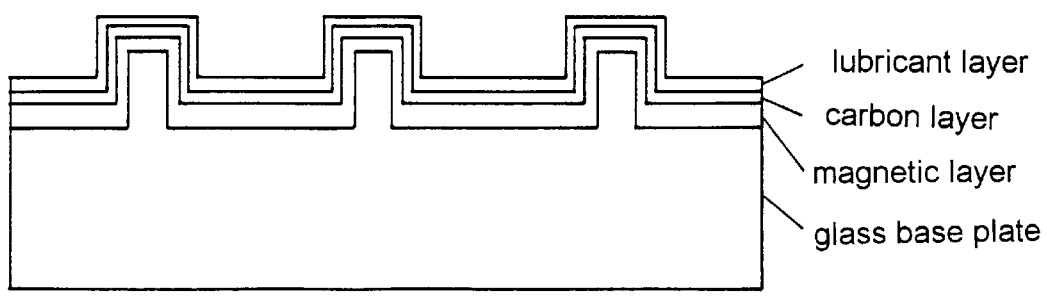

As shown in FIG. 10B, a processed depth of 8 nm was produced, and the surface roughness of processed substrate was less than 1 nm which was about the same as the initial surface roughness reading. A stepped profile of the fabricated surface was produced by contour transferring of the particles 120, and local variations in the processed depth was kept to less than ±5% over the entire surface of the substrate W. After the texturing step, the glass substrate W was carefully precision cleaned and coatings of a magnetic layer, a carbon layer and a lubrication layer were successively applied, as illustrated in FIG. 10C, to produce a final magnetic disk. In the above fabrication process, argon may be used for FAB in place of SF$_6$.

Figure 11:
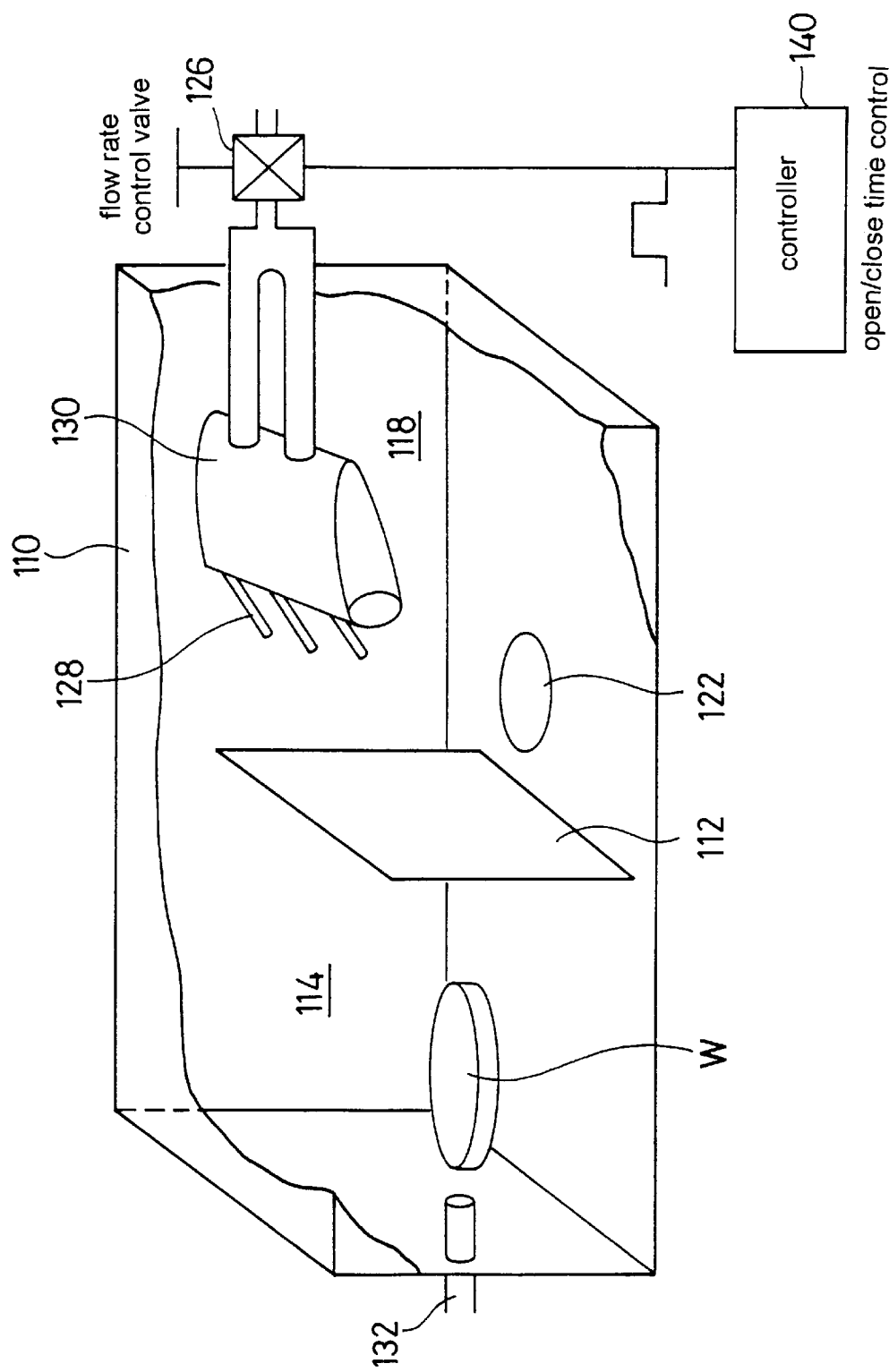
FIG. 11 is an illustration of another embodiment.
Figure 12:
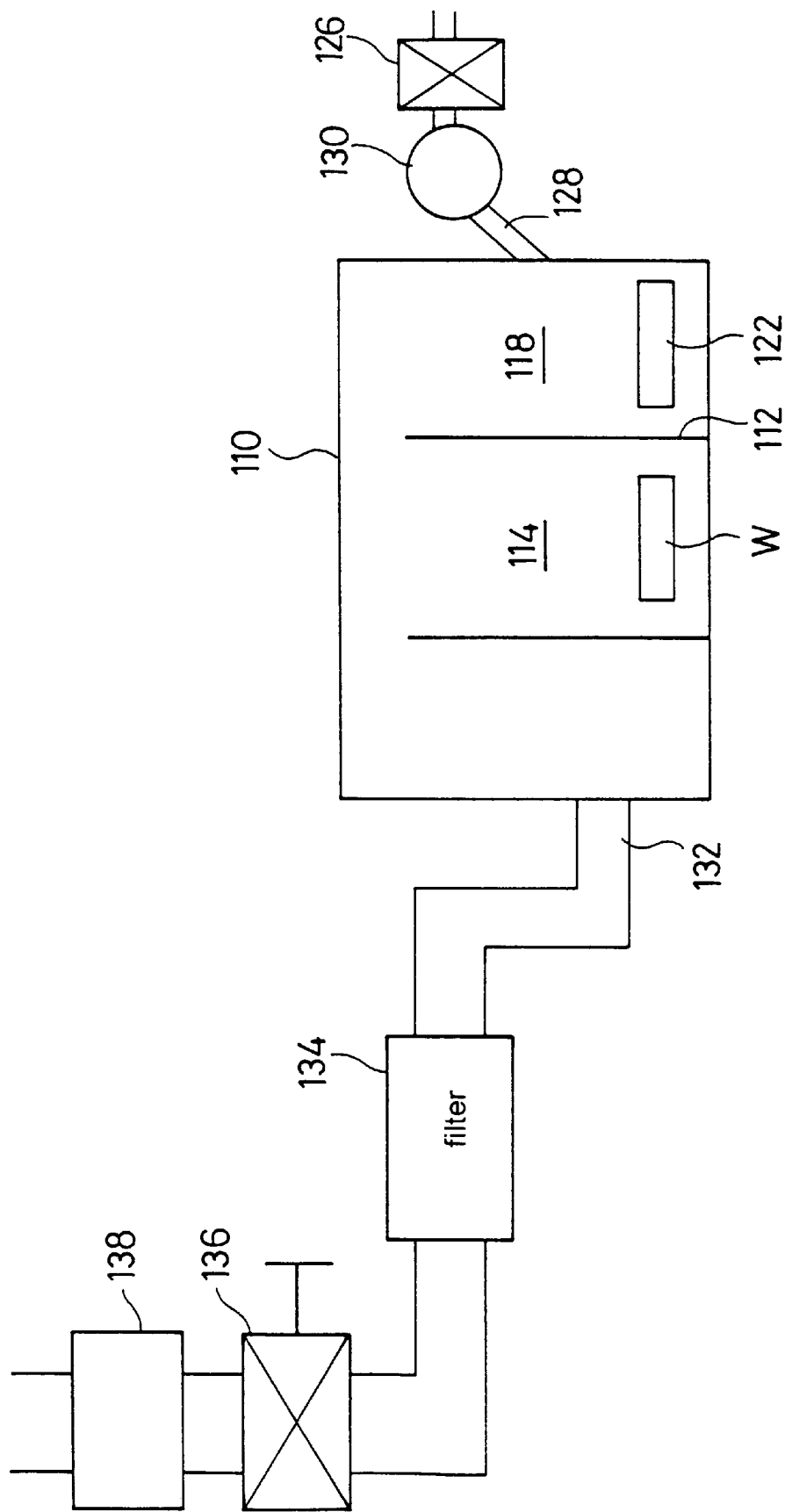
FIG. 12 is a schematic diagram of an overall fabrication facility.

FIGS. 11 and 12 show illustrations of another method of preparing a textured substrate according to the invention. In this case, particle dispersion chamber 110 is provided with a dry air source operated by dry air supply nozzle 128 through a flow control valve 126 to control air spray time and spray volume. In this apparatus, three spray nozzles 128 from an air reservoir tank 130 are directed to the particle tray 122. An exhaust opening 132 is provided on the dispersion chamber 110 and is connected to a blower 138 through a particle filter 134 and an exhaust valve 136 to exhaust the chamber air.

Flow control valve 126 is provided with a controller 140 to control the duration of valve opening/closing over a range of about 100 ms to 10 seconds, for example. To precisely control the air-dwelling time of the floating particles 120 (suspended by the gas flow generated by the nozzle 128) inside the chamber 110, exhaust valve 136 and blower 138 are activated at a certain time after the air spray is started, so that the floating particles 120 will be exhausted out of the chamber 110 to prevent excess settling of particles 120.

Figure 13:
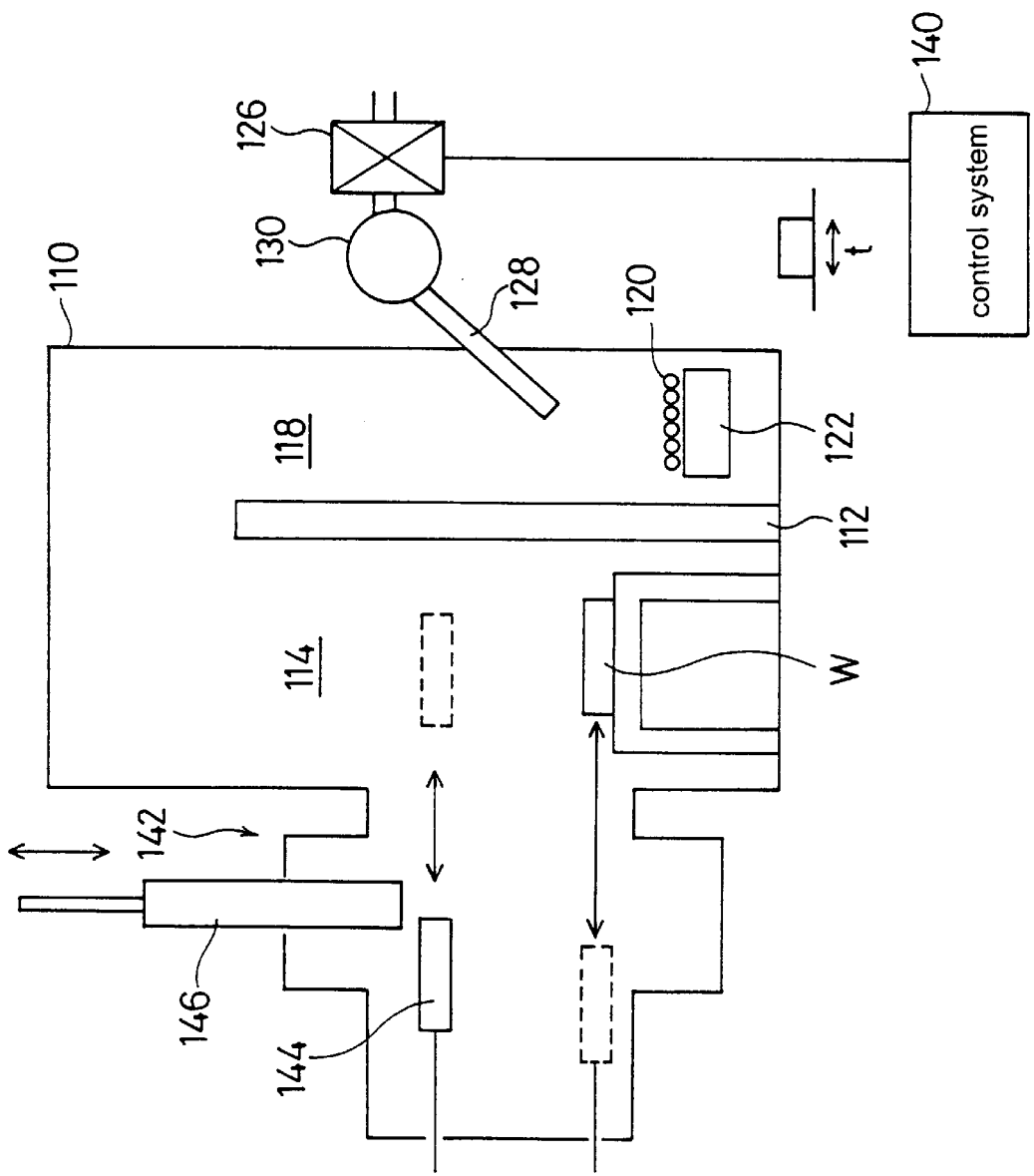
FIG. 13 is a schematic diagram of another overall fabrication facility.

FIG. 13 illustrates a facility for a still another embodiment of the method of preparing a textured substrate. This facility is provided with a load-lock chamber 142, a removable substrate cover 144 and a spray volume monitoring device to control a spraying time of the particles 120 even more precisely. In this facility, a substrate W is supplied through the load-lock chamber 142 by opening the gate 146 to the dispersion chamber 110, and after spraying the particles 120 for a given period of time, the substrate cover 144 is slid over directly above the substrate W through the load-lock chamber 142 to prevent excessive settling of particles 120. Substrate W and the substrate cover 144 are both retracted into the load-lock chamber 142 and the gate 146 is closed and substrate W is removed. Other conditions are the same as those in the first embodiment.

Figure 14:
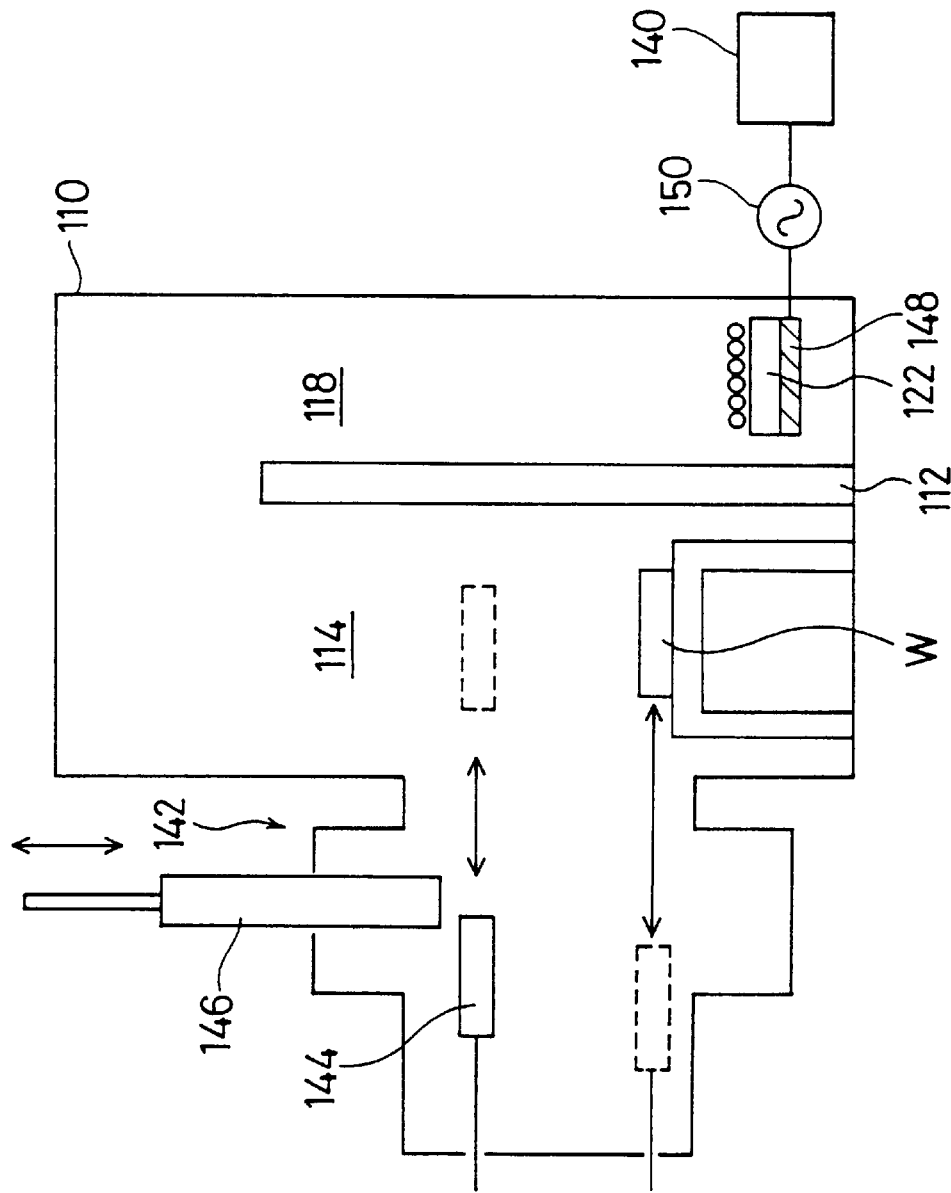
FIG. 14 is a schematic diagram of another overall fabrication facility.

FIG. 14 shows still another embodiment of the particle dispersion chamber. In this case, the gas spray device is replaced with a vibrator 148 to provide ultrasonic vibration to the particle tray 122 so that the particles 120 are ejected into the space above the tray 122 and are settled uniformly on the substrate W. By controlling the electrical source 150 by a controller 140 to produce appropriate amplitude and frequency of ultrasonic vibration, it is possible to disperse the particles 120 through gas spray 124 in the same manner as described in the first embodiment. Contour transferring trials carried out under similar condition as the first embodiment produced similar results.

Figure 15A:
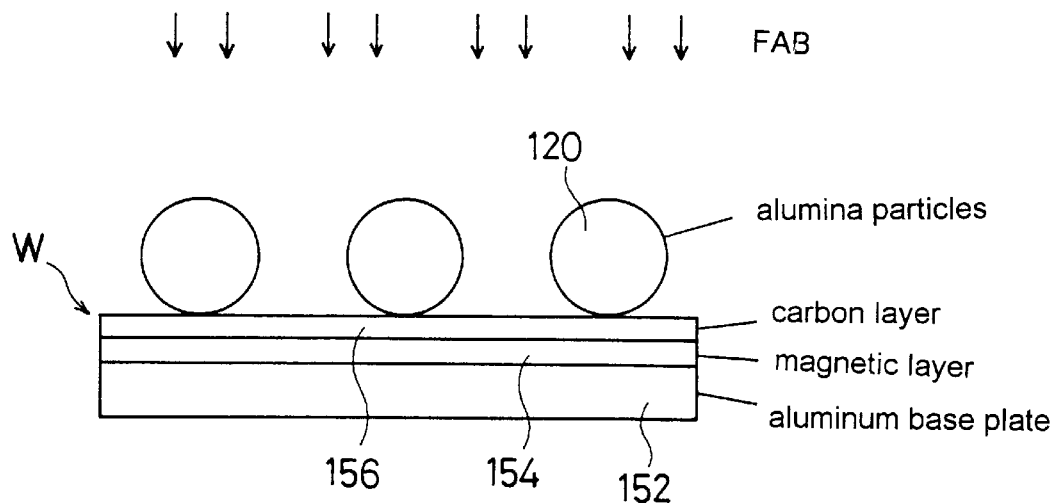
FIGS. 15A, 15B are illustrations of fabrication steps in another embodiment.
Figure 15B:
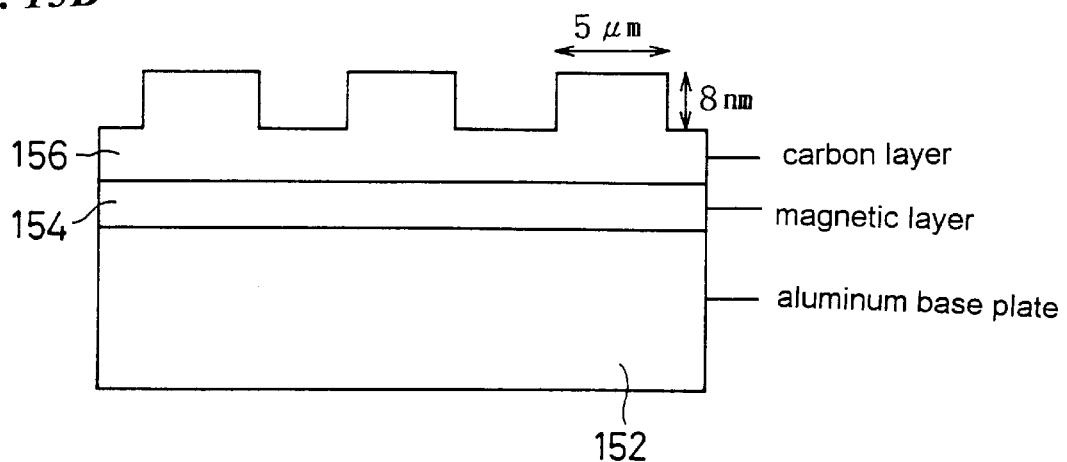

As shown in FIGS. 15A and 15B, an aluminum base plate 152 was coated with a magnetic layer 154 and carbon layer 156 to produce a substrate W, and surface textures were fabricated on the carbon layer 156. A carbon layer 156 of 5 mm thickness was applied to each surface of a 130 mm aluminum alloy base plate W, and micro-particles 120 were dispersed by the method described above.

Figure 16A:
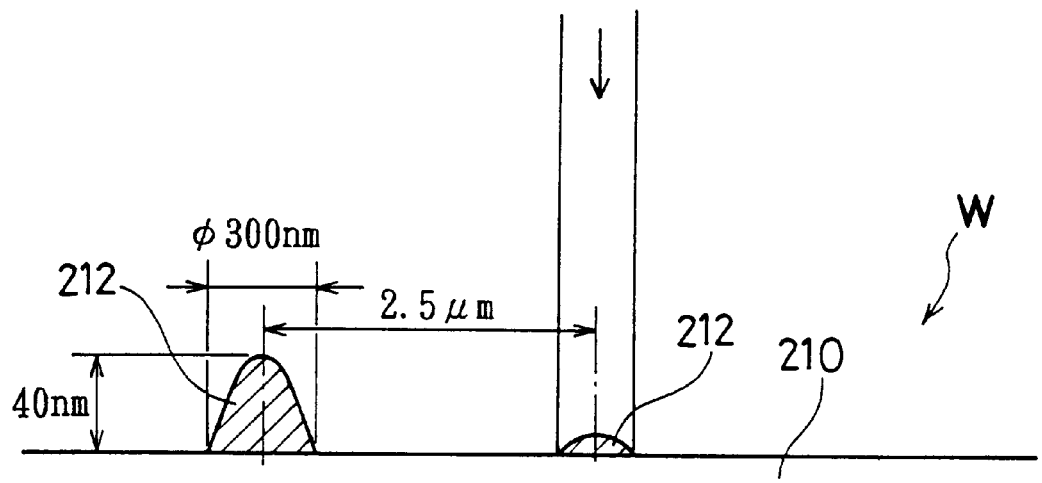
FIGS. 16A, 16B are illustrations of the steps in another embodiment of the method.
Figure 16B:
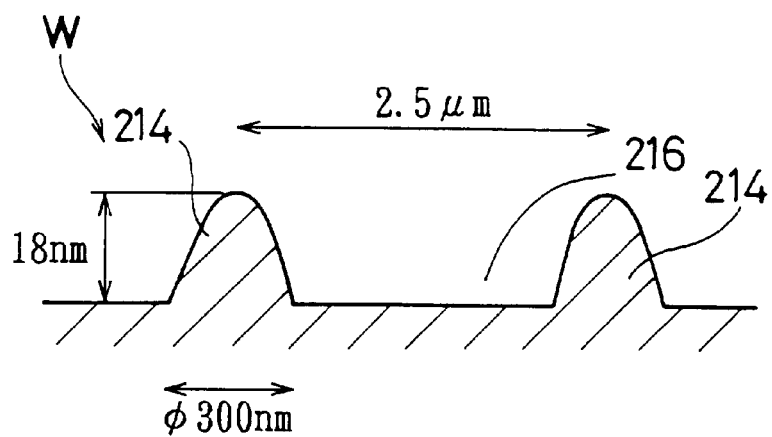

FIGS. 16A, 16B show a further embodiment of a magnetic disk made with an aluminum substrate W. A Ni—P layer 210 was applied to each surface of the aluminum substrate W. Initial surface roughness was less than 1 nm, and the size of the substrate W was 20~130 mm.

A carbon layer 212 was formed as a shielding mask on top of the Ni—P layer 210 using electron beam irradiation and fixed in place under the following conditions. An electron beam of 300 nm diameter at 10 keV and 10~11A current was directed on the substrate W for one minute in an evacuated fabrication chamber at a pressure of $10^{-5}$ torr. The evacuation system was based on an oil diffusion pump and no organic gas was introduced from external source. FIG. 16A illustrates the process of forming a textured structure under such conditions. Measurements by an atomic force microscope (AFM) showed that surface texture comprised cone-shaped micro-projections of 40 nm height and 300 nm bottom diameter separated at 2.5 μm.

Next, the substrate W thus produced was bombarded with FAB at right angles to the surface until the carbon structure disappeared. This process was carried out in the vacuum chamber and the substrate W was transported from the load-lock chamber, and was placed on the rotation/elevation stage as necessary. An argon based FAB, from a parallel plate type FAB source disclosed in Japanese Laid-open Patent Publication, 1993-182787, was radiated on the substrate W with the carbon layer layer 212. Material removal was adjusted by controlling the bombardment time. The source was operated at discharge voltage 4 kV, discharge current 315 mA and neutralization factor 80%, and a magnetic field generated from a magnetic field generator was applied at 500 gauss to control the plasma density.

AFM was used to examine the fabricated surface, and the results are illustrated in FIG. 16B. The difference in processing rate between the carbon and Ni—P layers produce a micro-protrusions 214 having a height of 18 nm (produced by faithful replication of the carbon layer pattern), and depressed regions 216. Surface roughness of the fabricated substrate was less than 1 nm regardless of the processing time. The processed pattern was reproduced from that of the mask, and over the entire surface, local deviation in processed depth was less than ±5%. The textured substrate is coated the successive application of a magnetic layer, a carbon layer, and a lubrication layer to produce a final ultra high density magnetic recording disk W.

Figure 17A:
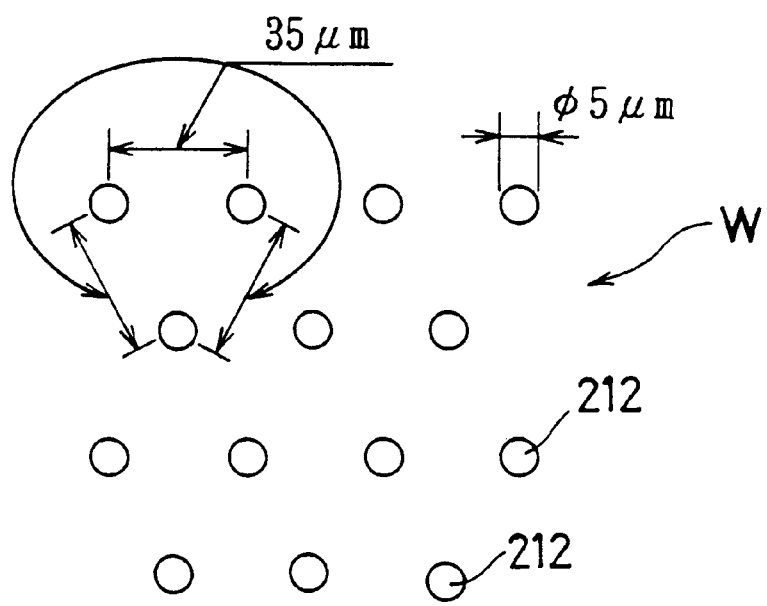
FIGS. 17A, 17B are illustrations of the steps in another embodiment of the method.

FIG. 17A shows another embodiment of the method for producing a micro-textured structure. In this case, a large diameter electron beam source is used to irradiate a substrate W through a mask to produce carbon layer 212. The electron beam irradiation was carried out under the following conditions: field energy of 5 keV, current density of 0.15 mA/cm², irradiation duration of 3 minutes. The masking pattern consisted of 5 μm diameter holes separated at 35 μm and arranged in an equilateral triangle shape. The material of the mask is Ni and is fabricated by electroforming. The results of measuring with a contact-type surface roughness meter and AFM showed that the carbon layer had a thickness of 18 nm.

Figure 17B:
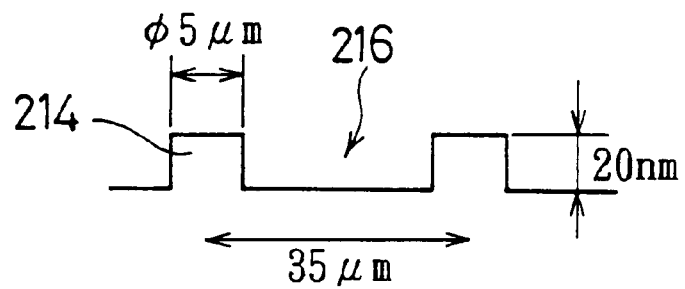

FIG. 17B illustrates the results of measurements taken with AFM on the texture produced by irradiating the above substrate with a FAB to the surface until the carbon layer 212 disappears. Transferred fabrication of carbon layer produced micro-protrusions 214 of a height of 20 nm and depressed region 216. Conditions for the vacuum chamber, FAB source, substrate and trials were the same as those in the previous embodiment.

Figure 18A:
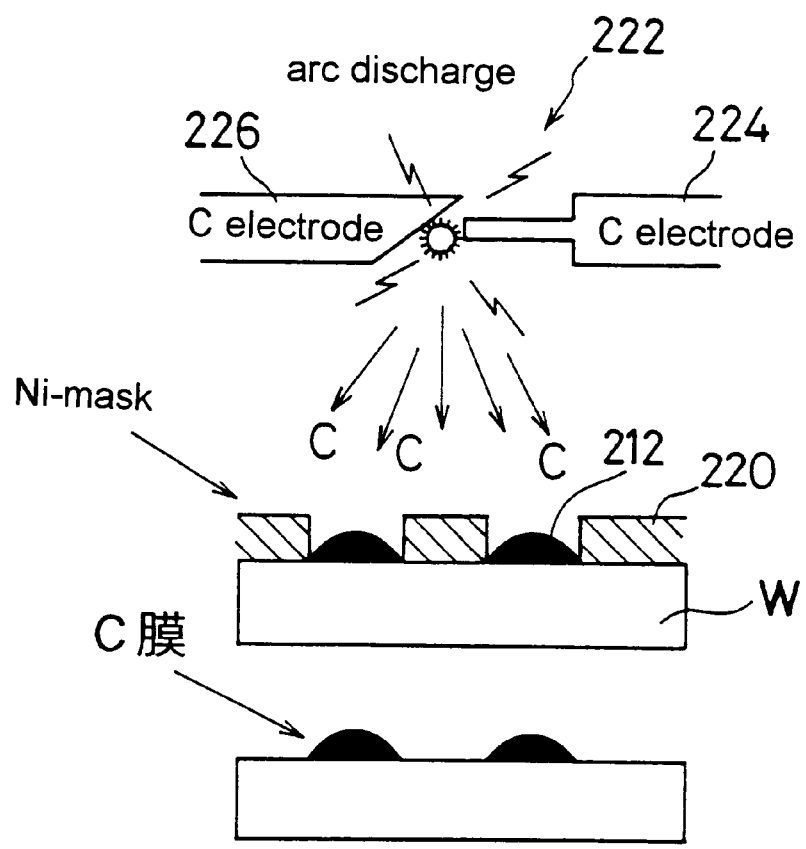
FIGS. 18A, 18B are illustrations of the steps in another embodiment of the method.
Figure 18B:
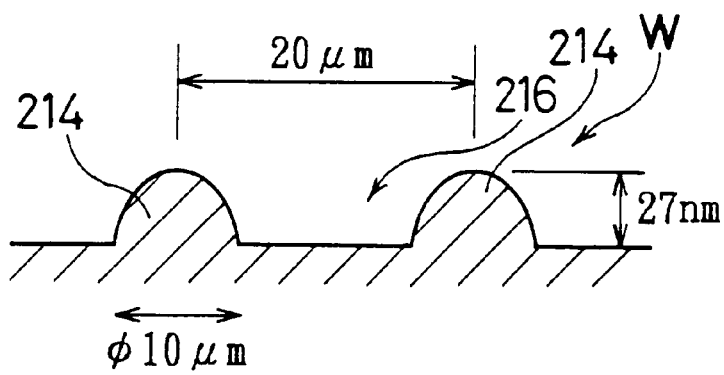

FIGS. 18A, 18B show still another embodiment of the method for producing a micro-textured structure. In this case, a combination of a mask 220 and a carbon vapor source 222 was used to form and fix a carbon layer 212 on a substrate W. FIG. 18A shows the basic steps of making a carbon layer. Carbon vapor was produced from a carbon vapor source 222 by touching two carbon electrodes 224, 226 to produce an arc and vaporize carbon by the intense heat generated. Arc discharge was carried out in pulses of 1 second interval and duration. Mask 220 was produced by the electroforming of a Ni sheet, and holes of 10 μm diameter separated at 20 μm were arranged in a square pattern. Carbon layer formation and fixation process were carried out in a vacuum of 0.01 torr.

FIG. 18B shows the results of measurements with AFM of the texture produced by processing the carbon layer 212 with FAB until the carbon disappeared. The surface texture is comprised by cone-shaped micro-protrusions 214 (of a height 27 nm and base diameter 10 μm separated at 20 μm) and depressed regions 216 therebetween. It is considered important that a textured structure should have a cone-shaped profile so as to minimize possible contact between the magnetic head and reduce dynamic friction. Fabrication method by FAB and other conditions for testing are the same as those in the first embodiment.

Figure 19:
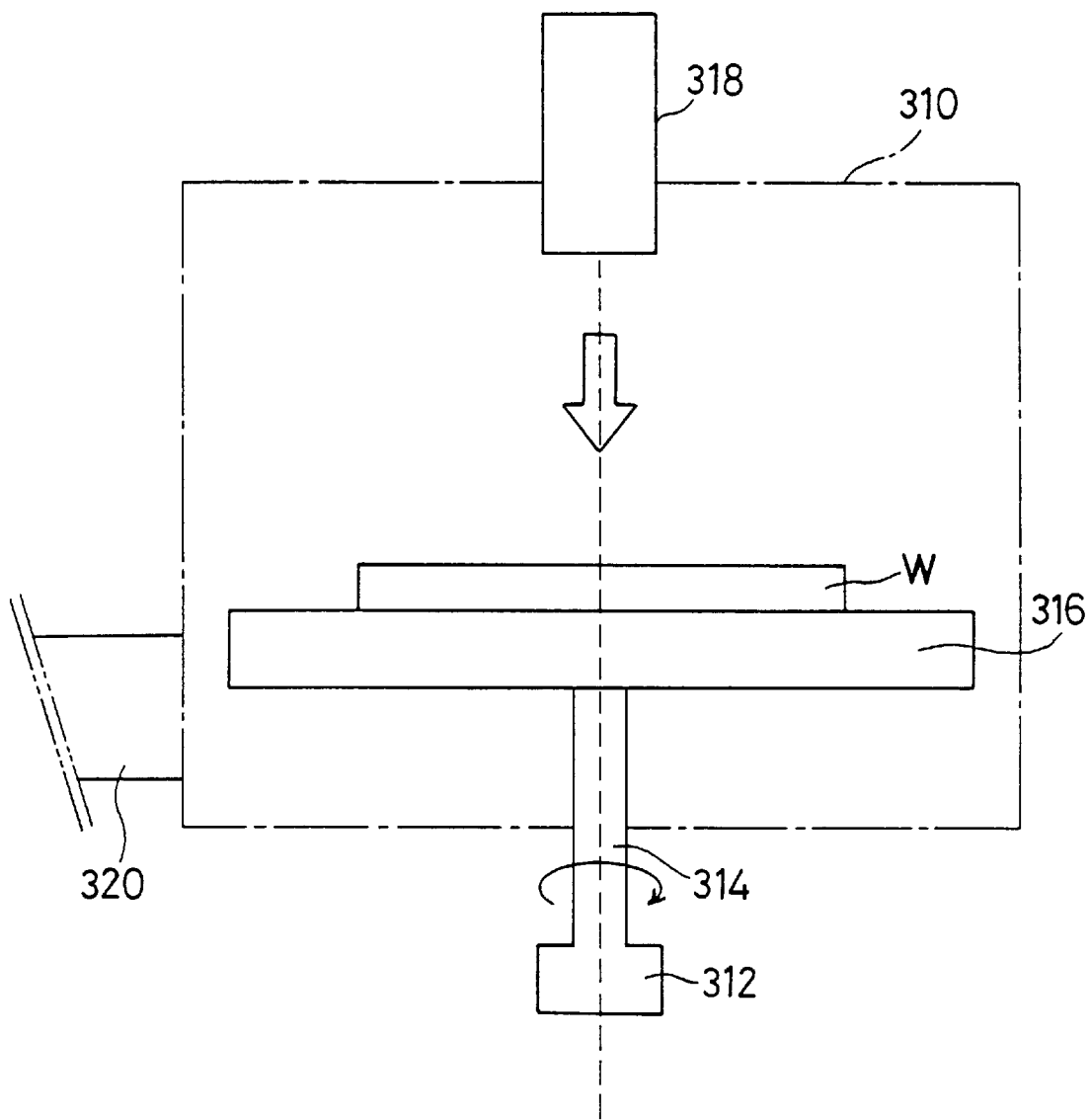
FIG. 19 is a schematic diagram of a fabrication apparatus used in the embodied method.

In the following, embodiments of texturing apparatus will be presented. FIG. 19 shows a texture fabrication apparatus used in making various surface textures presented in the present invention.

FIG. 19 shows a schematic drawing of a texture fabrication apparatus comprised of a hermetic fabrication chamber 310; a rotation stage 316 which is rotatably/elevatably supported by a shaft 314 and driven by a drive device 312 located inside the chamber 310; and a fast atomic beam (FAB) source 318 of a parallel plate type, disposed inside the chamber 310 opposite to the rotation stage 316. The fabrication chamber 310 is communicated with a vacuum pump (not shown) through evacuation port 320 and a substrate W is transported through a load-lock chamber (not shown).

Figure 20:
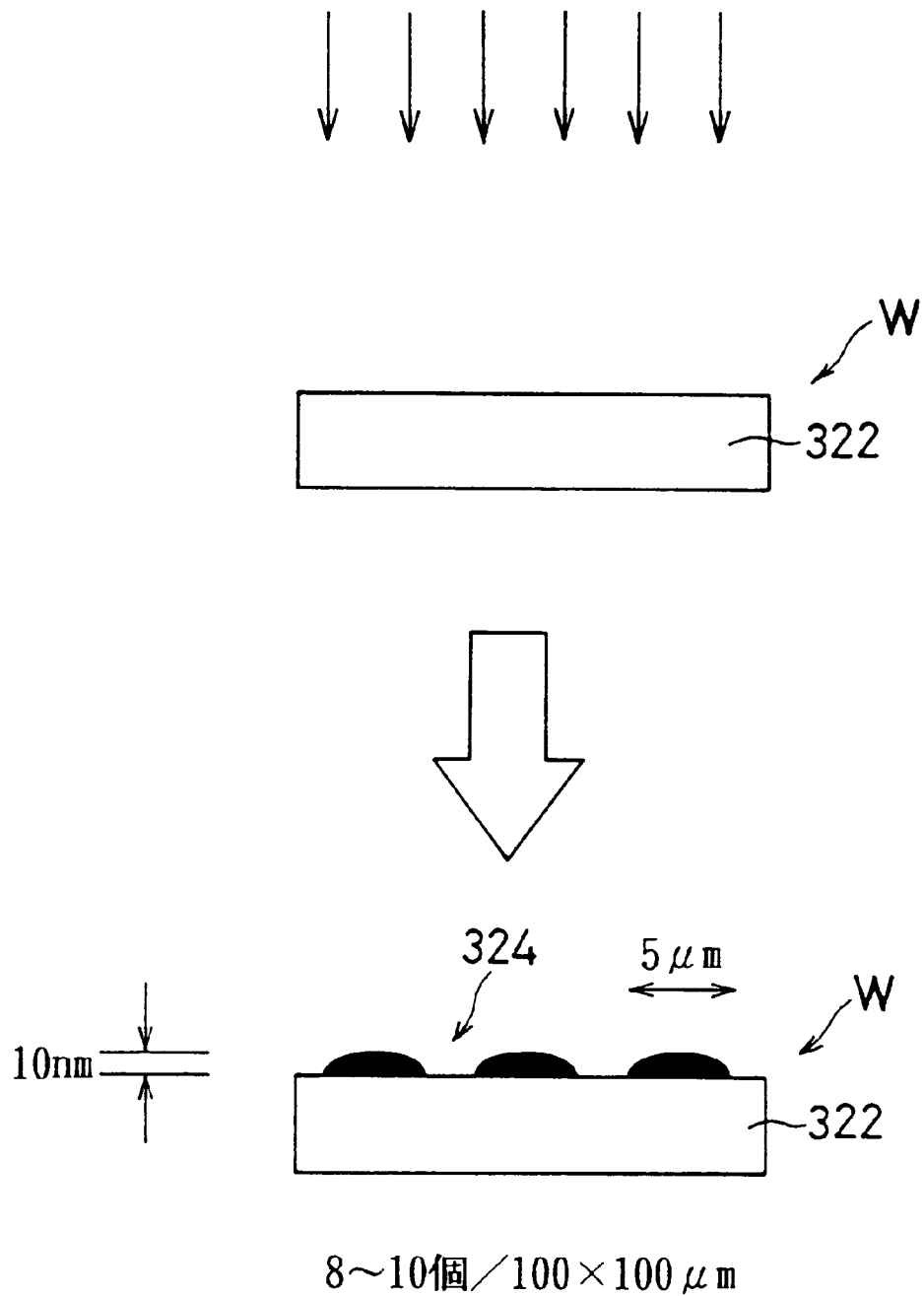
FIG. 20 is an illustration of another method of fabrication of the present invention.

FIG. 20 shows an example of the process of making a magnetic disk, in which the surface of a base plate 322 itself is sputtered directly to fabricate micro-waviness. The size of the substrate W is 20~130 mm, and the base plate is aluminum. The magnetic disk W is placed on the rotation stage 316, and is bombarded with a chlorine FAB.

Figure 21:
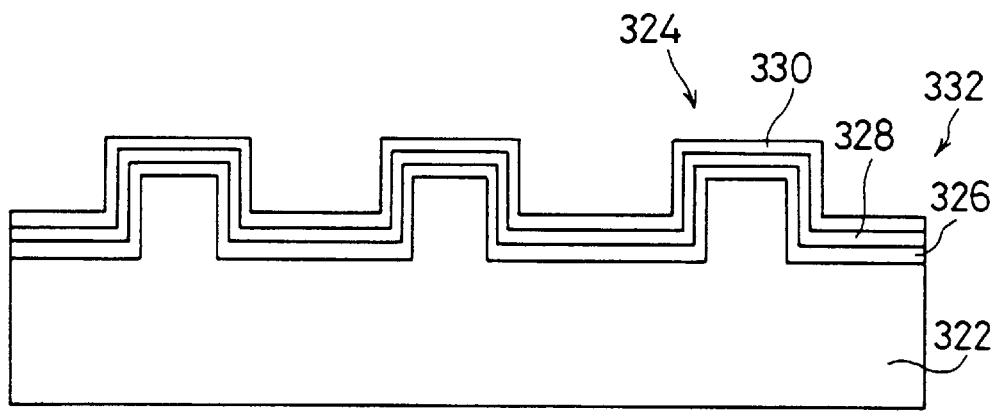
FIG. 21 is a cross sectional view of a magnetic disk produced by the method shown in FIG. 20.

Operational parameters for the FAB source 318 are as follows: sputtering duration, 20 minutes; gas flow rate, 2 sccm; discharge voltages, 1.5 kV; discharge current, 50 mA; and substrate temperature, 100° C. Plasma control was effected by applying a magnetic field at 300 gauss. After the FAB irradiation, substrate W is cooled to room temperature, and removed from the fabrication chamber 310. The surface was examined under a scanning electron microscope (SEM). A micro-textured structure was produced on the fabrication surface by re-deposition of products generated by an interaction of the sputtered substance from the fabrication surface, produced by chlorine FAB bombardment on the fabrication surface of the substrate W. with the surface and the FAB. The aluminum base plate 322 having the substrate micro-textured structure 324 was coated with successive layers of a Ni—P layer 326, a magnetic layer 328 and a carbon layer 330 to produce a final magnetic disk 332 shown in FIG. 21.

Figure 22:
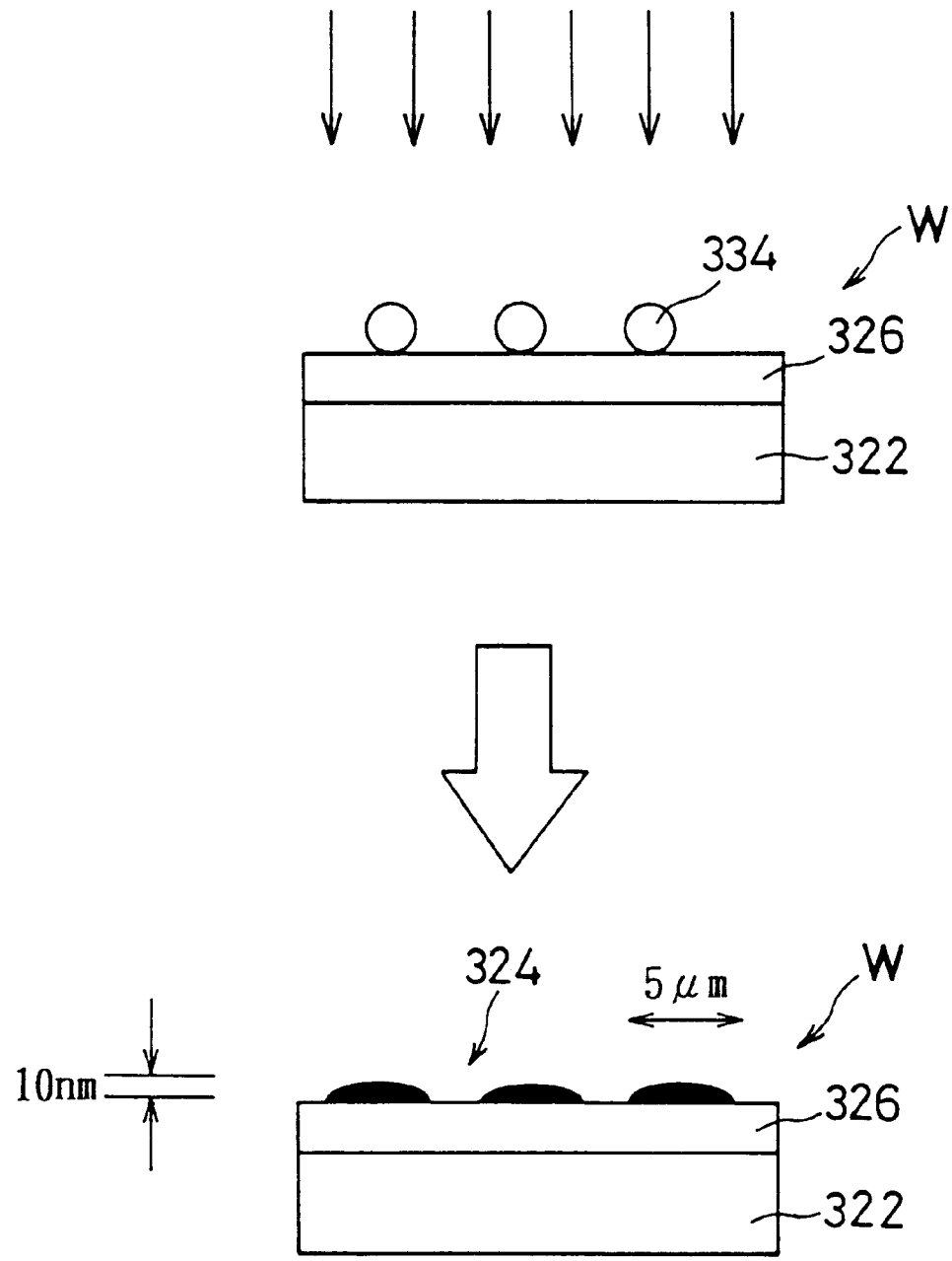
FIG. 22 is an illustration of another method of fabrication of the present invention.
Figure 24A:
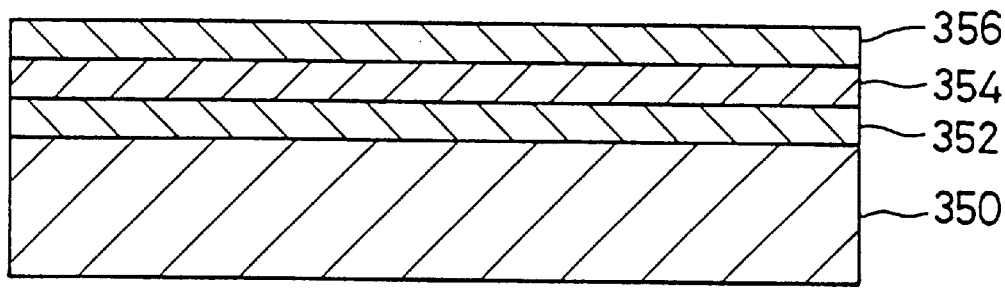
FIGS. 24A, 24B are cross sectional views of a common magnetic disk.
Figure 24B:
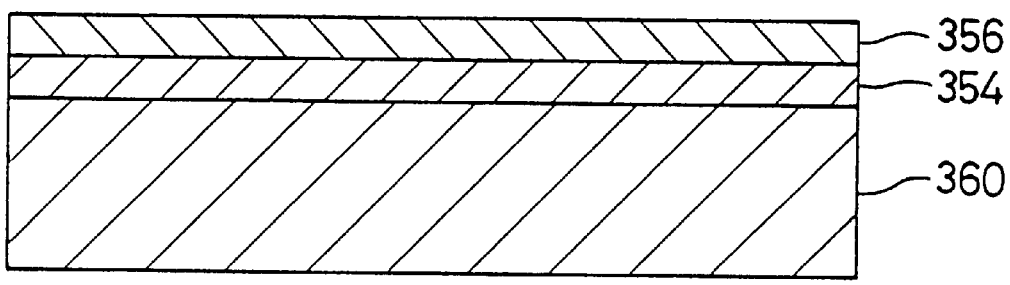

FIG. 22 illustrates schematically another method of making a magnetic disk. In this method, the entire surface of a Ni—P layer 326 to be sputtered is coated with a uniform dispersion of sulfur-containing micro-particles 334 to produce a micro-textured structure 324. The dispersion is produced by dispersing micro-particles in an ethanol solution and dripping the ethanol solution on the Ni—P layer 326.

Figure 23:
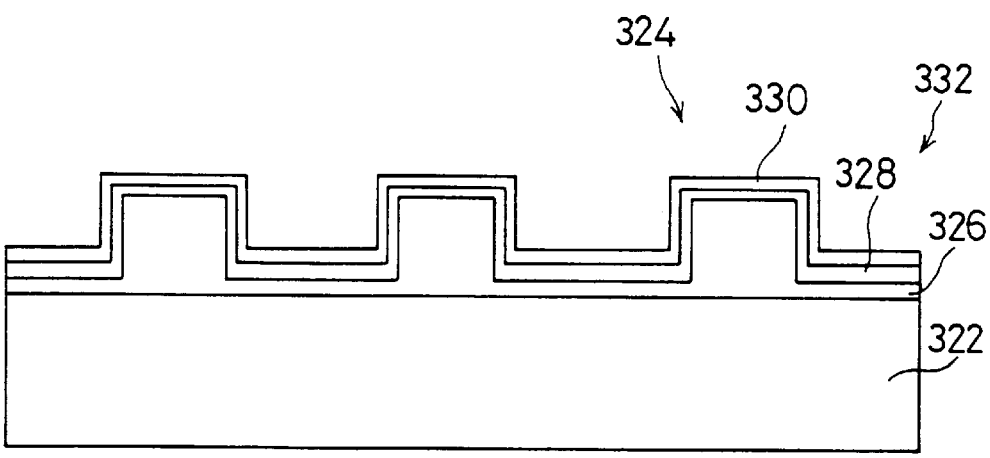
FIG. 23 is a cross sectional view of a magnetic disk produced by the method shown in FIG. 22.

A chlorine based FAB was operated under the following conditions: irradiation duration, 39 seconds; gas flow rate, 10 sccm; discharge voltage, 3.0 kV; discharge current, 300 mA; and the substrate temperature, 100° C. Plasma density was controlled by applying a magnetic field produced from a magnetic field generator at 400 gauss. The processed substrate was cooled to room temperature, and was removed from the vacuum chamber 310 and cleaned ultrasonically to remove the particles. Observation was made by SEM to confirm the production of micro-texturing on the Ni—P layer 326. The substrate W having the base micro-waviness 324 thus produced was successively coated by applying a magnetic layer 328, a carbon layer 330 to produce a final magnetic disk 332, as shown in FIG. 23.

What is claimed is:

1. A method for fabricating a textured structure with micro-waviness on a fabrication surface of a substrate, comprising:

dispersing micro-particles contained in a micro-particle source in a gaseous atmosphere;

settling and attaching the dispersed micro-particles on the fabrication surface; and irradiating a high energy beam on the fabrication surface so as to transfer contours of the micro-particles to the fabricating surface;

wherein in said dispersing and in said settling and attaching the micro-particles are first uplifted into the gaseous atmosphere and then settled down towards the substrate.

2. The method according to claim 1, where said dispersing of the micro-particles is performed by jetting a gas stream onto the micro-particle source.

3. The method according to claim 1, wherein said dispersing of the micro-particles is performed by ultrasonically vibrating the micro-particle source.

4. The method according to claim 1, wherein electrodes are provided and the micro-particles are placed on the electrodes, and the substrate is placed at a specific distance from the micro-particles, and an electrical field generated by a direct current source or an alternating current source is impressed between the substrate and the electrodes.

5. The method according to claim 1, wherein an electrical field, from a direct current source or a high frequency source, is impressed on a space including the micro-particles and the substrate.

6. A method of forming a textured structure with micro-waviness on a surface of a substrate for a magnetic disk for reducing dynamic friction and controlling head float, comprising:

forming a shielding mask comprising a thin carbon layer of a specific pattern on a fabrication surface of the substrate by decomposing a carbon source, the carbon source including a gaseous organic substance that has been introduced into an evacuated processing space, on the fabrication surface by irradiating with an electron beam; and irradiating the substrate with a high energy beam so as to transfer the specific pattern to the fabrication surface, thereby forming the textured structure.

7. The method according to claim 6, wherein said thin carbon layer is further formed by irradiating said fabrication surface with the electron beam through a shielding mask having a specific pattern.

8. The method according to claim 6, wherein said thin carbon layer is further formed by scanning said fabrication surface with the electron beam to form a regular pattern or an irregular pattern.

9. The method according to claim 6, wherein said textured-structure is produced by continuing to irradiate said thin carbon layer formed on said fabrication surface with a high energy beam until said thin carbon layer is eliminated.

10. A method of forming a textured structure with micro-waviness on a surface of a substrate for a magnetic disk for reducing dynamic friction and controlling head float, said method comprising:

providing a substance to be sputtered on a fabricating surface of the substrate, the substance comprising sulfur; and irradiating the fabricating surface with a high energy beam so as to generate a sputtered substance and so that products generated by mutual interaction of the sputtered substance with at least one of the high energy beam and the fabrication surface are re-deposited on the fabrication surface, thereby forming the textured structure.

11. The method according to claim 10, wherein said high energy beam is a fast atomic beam produced from a fast atomic beam source operating on gaseous chlorine.

* * * * *